(12) United States Patent
Tanaka et al.

(10) Patent No.: US 8,389,201 B2
(45) Date of Patent: Mar. 5, 2013

(54) POSITIVE RESIST COMPOSITION AND PATTERN FORMING PROCESS

(75) Inventors: Akinobu Tanaka, Jyoetsu (JP); Keiichi Masunaga, Jyoetsu (JP); Daisuke Domon, Jyoetsu (JP); Satoshi Watanabe, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 229 days.

(21) Appl. No.: 12/786,013

(22) Filed: May 24, 2010

(65) Prior Publication Data

US 2011/0003251 A1    Jan. 6, 2011

(30) Foreign Application Priority Data

Jul. 1, 2009 (JP) ................................. 2009-156784

(51) Int. Cl.
*G03F 7/039* (2006.01)
*G03F 7/20* (2006.01)
*G03F 7/30* (2006.01)

(52) U.S. Cl. ..................... 430/270.1; 430/905; 430/907; 430/921; 430/311; 430/326; 430/274.1; 430/275.1

(58) Field of Classification Search .......................... None
See application file for complete search history.

(56) References Cited

U.S. PATENT DOCUMENTS

| | | | |
|---|---|---|---|
| 2002/0111459 A1 | 8/2002 | Takeda et al. | |
| 2006/0166133 A1 | 7/2006 | Koitabashi et al. | |
| 2006/0183051 A1 | 8/2006 | Takeda et al. | |
| 2007/0218406 A1 | 9/2007 | Mizutani et al. | |
| 2008/0090179 A1 | 4/2008 | Takeda et al. | |
| 2008/0241751 A1 | 10/2008 | Takeda et al. | |
| 2008/0274422 A1 | 11/2008 | Masunaga et al. | |
| 2010/0009299 A1* | 1/2010 | Watanabe et al. | 430/326 |
| 2010/0159404 A1* | 6/2010 | Hatakeyama et al. | 430/326 |

FOREIGN PATENT DOCUMENTS

| | | |
|---|---|---|
| CN | 1821879 A | 8/2006 |
| CN | 101299131 A | 11/2008 |
| EP | 2 000 851 A1 | 12/2008 |
| JP | A-2002-234910 | 8/2002 |
| JP | A-2002-244297 | 8/2002 |
| JP | A-2003-122011 | 4/2003 |
| JP | A-2003-246825 | 9/2003 |
| JP | A-2004-149756 | 5/2004 |
| JP | A-2005-330369 | 12/2005 |
| JP | A-2006-169302 | 6/2006 |
| JP | A-2006-201532 | 8/2006 |
| JP | A-2006-215180 | 8/2006 |
| JP | A-2008-096951 | 4/2008 |
| JP | A-2008-249762 | 10/2008 |

OTHER PUBLICATIONS

Derwent English Abstract for JP2003-122011 (2003).*
European Search Report issued in Application No. 10 00 5865; Dated Mar. 2, 2011.
Japanese Office Action issued in Application No. 2009-156784; Dated Sep. 20, 2011 (With Translation).
Partial European Search Report issued in Application No. 10 00 5865; Dated Nov. 19, 2010.
Chinese Office Action dated Oct. 30, 2012 in Chinese Patent Application No. 201010221430.8 (with partial English-language translation).
Chinese Search Report dated Oct. 30, 2012 in Chinese Patent Application No. 201010221430.8 (with English-language translation).

* cited by examiner

*Primary Examiner* — Sin J. Lee
(74) *Attorney, Agent, or Firm* — Oliff & Berridge, PLC

(57) ABSTRACT

The present invention relates to a positive resist composition and to a pattern forming process using the same. The present invention provides: a positive resist composition having an enhanced etching resistance and an excellent resolution and being capable of providing an excellent pattern profile even at a substrate-side boundary face of resist, in photolithography for fine processing, and particularly in lithography adopting, as an exposure source, KrF laser, extreme ultraviolet rays, electron beam, X-rays, or the like; and a pattern forming process utilizing the positive resist composition.

10 Claims, No Drawings

POSITIVE RESIST COMPOSITION AND PATTERN FORMING PROCESS

BACKGROUND OF THE INVENTION

1. Field of the Invention

The present invention relates to a positive resist composition and to a pattern forming process using the same.

2. Description of the Related Art

It is well known that as LSI progresses toward a higher integration and a further acceleration in speed, a miniaturization of a pattern rule is required. Accompanying with this trend, an exposure method and a resist material are drastically changing. In particular, when a lithography of a pattern with 0.2 μm or less is carried out, KrF or ArF excimer laser beams, an electron beam, or the like are used as an exposure light source, and a chemically amplified type showing a good sensitivity to those high energy beams and giving a high resolution is used for a photoresist.

Resist compositions are classified into a positive type where exposed areas are made to be solvable and a negative type where exposed areas are left as a pattern, and that one of them is selected and used, which can be more conveniently handled depending on a required resist pattern. Further, chemically amplified positive resist compositions are each typically configured to contain: polymer, which is insoluble or poorly-soluble in an aqueous alkaline developer, and which is decomposed by an acid and turned thereby to be soluble in an alkaline developer; and an acid generator to be decomposed by exposure light to produce an acid; as well as a basic compound for restricting diffusion of the acid produced by the typical exposure.

Negative resist compositions of a type configured to adopt phenol units as alkali-soluble units constituting a polymer to be dissolved in the aqueous alkaline developer, have been numerously developed, and particularly for exposure by a KrF excimer laser light. Since phenol units of these compositions do not exhibit light transmittivity in the case of exposure light having wavelengths in a range of 150 to 220 nm, the compositions have not been used for ArF excimer laser light. However, such negative resist compositions have been recently noticed again as ones for EB or EUV exposure which are exposure methods for obtaining finer patterns, and reports thereof are found in Japanese Patent Laid-open (Kokai) Nos. 2006-201532, 2006-215180 and 2008-249762, and the like.

Further, examples of characteristics to be demanded for resist compositions in the case of the resist elaboration as noted above, include not only a higher resolution which is a fundamental performance of a resist, but also a higher etching resistance. This is because, progressively finer patterns necessitate to progressively decrease thicknesses of resist films. Known as one technique for obtaining such a higher etching resistance, is a method, which also has been disclosed in Japanese Patent Laid-open (Kokai) No. 2008-249762, to introduce, as subsidiary components of the polymer: a polycyclic compound such as indene and acenaphthylene, which includes an aromatic ring(s) and a non-aromatic ring(s), and in which the non-aromatic ring has a carbon-carbon double bond conjugated with the aromatic ring; into a polymer having hydroxystyrene units.

In turn, as polymers for positive resists, it has been proposed to use a polymer having only indene structures such as described in Japanese Patent Laid-open (Kokai) No. 2004-149756, while another method has been proposed in Japanese Patent Laid-open (Kokai) No. 2006-169302 to use units having acenaphthylene structures by combining them with a hydroxystyrene derivative.

However, in trying to conduct such a fine processing that gaps between line widths are decreased down to as narrow as 50 nm which is demanded in the presently most-advanced processing technique, bridges are caused between pattern lines even by variously conducting a fine control by adopting a polymer system which has been conventionally presented for a positive resist composition, thereby making it difficult to form a fine pattern.

SUMMARY OF THE INVENTION

Conventionally, such a problem of bridges between pattern lines has been solved to a certain extent, by adopting a method to increase an amount of a basic component to be added into a resist composition, thereby enhancing a contrast against an acid. However, such a solving method inevitably deteriorates a sensitivity of the resist, due to the increased amount of the basic component. Further, it is typical in conventional methods to deal with a sensitivity deterioration by increasing an addition amount of an acid generator. However, adoption of a large amount of an acid generator results in a problem of attenuation of exposure light within a film in case that an energy source for pattern exposure is light, and results in a problem of occasional incapability of further increasing the amount of the acid generator in case that the energy source is an electron beam because a considerably large amount of the acid generator has been already added.

Further, when the resist is to be used at a film thickness of 100 nm or less so as to form a finer pattern, the resist composition therefore is required to be a material enhanced in etching resistance.

The present invention has been carried out in view of the above circumstances, and it is therefore an object of the present invention to provide: a positive resist composition having an enhanced etching resistance and an excellent resolution and being capable of providing an excellent pattern profile even at a substrate-side boundary face of resist, in photolithography for fine processing, and particularly in lithography adopting, as an exposure source, KrF laser, extreme ultraviolet rays, electron beam, X-rays, or the like; and a pattern forming process utilizing the positive resist composition.

To solve the above problem, the present invention provides a positive resist composition comprising at least:

(A) a base resin, which has acidic functional groups protected by acid labile groups, respectively, and is insoluble or hardly soluble in alkali, and which is turned to be soluble in alkali upon elimination of the acid labile groups;

(B) an acid generator; and (C) a nitrogen-containing compound as a basic component;

wherein the base resin is: a polymer containing repeating units each represented by the following general formula (1); or a polymer containing repeating units each represented by the general formula (1), and containing at least one or more kinds of repeating units each represented by the following general formula (2) and repeating units each represented by the following general formula (3); and wherein the base resin contains the repeating units represented by the general formulae (1), (2), and (3), respectively, at a sum ratio of 70 mole % or more relative to a total amount of all repeating units constituting the base resin:

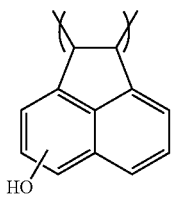

(1)

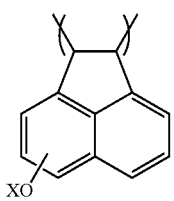

(2)

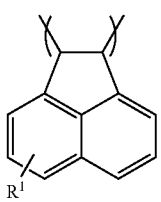

(3)

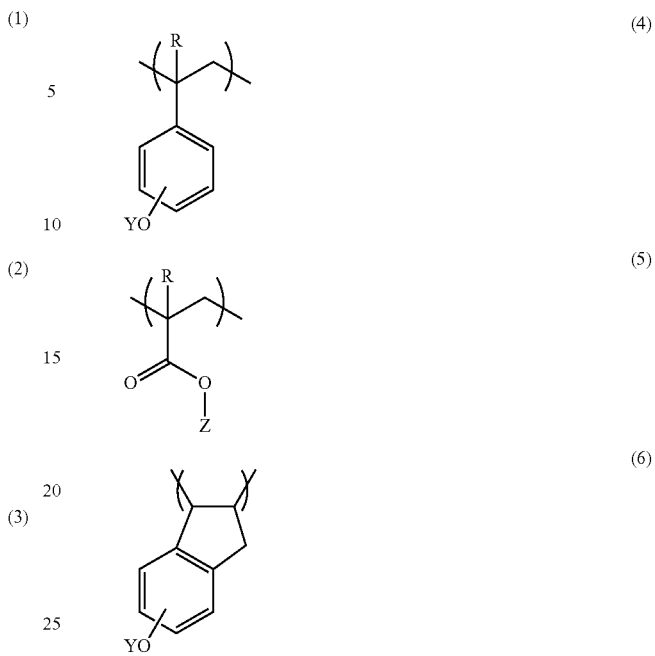

wherein,

X represents an acid labile group; and $R^1$ represents a hydrogen atom, a halogen atom, a linear, branched, or cyclic alkyl group having 1 to 10 carbon atoms, a linear, branched, or cyclic alkoxy group having 1 to 10 carbon atoms and being uneliminatable by an acid, or a linear, branched, or cyclic acyl group having 1 to 10 carbon atoms and being uneliminatable by an acid;

wherein X and $R^1$ may be selected in multiple kinds, respectively.

In this way, when the resin to be used as the base resin is: a polymer containing repeating units each represented by the above general formula (1); or a polymer containing repeating units each represented by the general formula (1), and containing at least one or more kinds of repeating units each represented by the above general formula (2) and repeating units each represented by the above general formula (3); and the base resin contains the repeating units represented by the general formulae (1), (2), and (3), respectively, at a sum ratio of 70 mole % or more relative to a total amount of all repeating units constituting the base resin; the positive resist composition prepared by adopting the base resin is configured to include acenaphthylene derivative repeating units at a higher ratio, thereby enabling to form a resist film capable of exhibiting an enhanced etching resistance and simultaneously obtaining a higher resolution of 50 nm or less.

It is preferable that the base resin contains, as the repeating units having the acidic functional groups protected by the acid labile groups, respectively, at least one or more kinds of the repeating units each represented by the general formula (2), repeating units each represented by the following general formula (4), repeating units each represented by the following general formula (5), and repeating units each represented by the following general formula (6):

wherein,

Y and Z each represent an acid labile group; and

R represents a hydrogen atom or a methyl group;

wherein Y, Z, and R may be selected in multiple kinds, respectively.

In this way, when the base resin contains, as the repeating units having the acidic functional groups protected by the acid labile groups, respectively, at least one or more kinds of the repeating units each represented by the general formula (2), repeating units each represented by the above general formula (4), repeating units each represented by the above general formula (5), and repeating units each represented by the above general formula (6), it is enabled to vary a solubility of a resist in a developer upon exposure of the resist, and to readily conduct adjustment of a reactivity of the resin in such a manner to slightly lower the rigidity of the resin to thereby adjust a resolution, a pattern profile, and the like.

Further, it is preferable that the base resin contains, as the repeating units having the acidic functional groups protected by the acid labile groups, respectively, repeating units each represented by the following general formula (5-1):

(5-1)

wherein,

R represents a hydrogen atom or a methyl group; and $Z^1$ is selected from groups represented by the following general formulae (7) and (8), respectively:

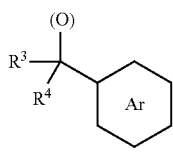

(7)

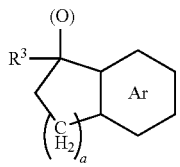

(8)

wherein,

represents a substituted or unsubstituted aromatic hydrocarbon group;

$R^3$ represents a linear, branched, or cyclic alkyl group having 1 to 12 carbon atoms; and $R^4$ represents a hydrogen atom, a linear, branched, or cyclic alkyl group having 1 to 12 carbon atoms, or an aromatic hydrocarbon group; or $R^3$ and $R^4$ may cooperatively form a ring together with a carbon atom to which they are bonded, and in that case, $R^3$ and $R^4$ cooperatively represent an alkylene group having 4 to 12 carbon atoms;

"a" represents 1 or 2; and (O) represents an oxygen atom of a carboxyl group and is depicted to indicate a bonded position of each of the groups of the general formulae (7) and (8), respectively.

In this way, when the base resin contains, as the repeating units having the acidic functional groups protected by the acid labile groups, respectively, repeating units each represented by the general formula (5-1), the resin is caused to have a higher reactivity with an acid, thereby enabling to provide a higher resolution.

It is preferable that the base resin contains, as the repeating units having the acidic functional groups protected by the acid labile groups, respectively, the repeating units each represented by the general formula (2), as well as the repeating units each represented by the following general formula (4), and the repeating units each represented by the following general formula (5-1);

wherein the acid labile group X is an acetal group, and the following acid labile group Y is a tertiary alkyl group having 4 to 15 carbon atoms:

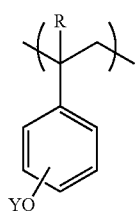

(4)

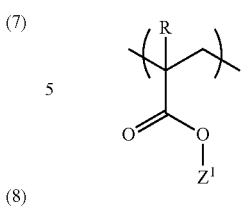

(5-1)

wherein,

R represents a hydrogen atom or a methyl group;

Y represents an acid labile group; and $Z^1$ is selected from groups represented by the following general formulae (7) and (8), respectively:

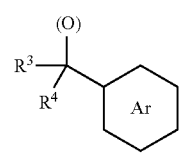

(7)

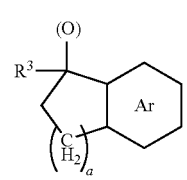

(8)

wherein,

represents a substituted or unsubstituted aromatic hydrocarbon group;

$R^3$ represents a linear, branched, or cyclic alkyl group having 1 to 12 carbon atoms, and $R^4$ represents a hydrogen atom, a linear, branched, or cyclic alkyl group having 1 to 12 carbon atoms, or an aromatic hydrocarbon group; or $R^3$ and $R^4$ may cooperatively form a ring together with a carbon atom to which they are bonded, and in that case, $R^3$ and $R^4$ cooperatively represent an alkylene group having 4 to 12 carbon atoms;

"a" represents 1 or 2; and (O) represents an oxygen atom of a carboxyl group and is depicted to indicate a bonded position of each of the groups of the general formulae (7) and (8), respectively.

In this way, when the base resin containing, as the repeating units having the acidic functional groups protected by the acid labile groups, respectively, the repeating units each represented by the general formula (2), as well as the repeating units each represented by the general formula (4), and the repeating units each represented by the general formula (5-1), in which the acid labile group X is an acetal group, and the acid labile group Y is a tertiary alkyl group having 4 to 15 carbon atoms, is used as the base resin of the positive resist composition, a preferable contrast is obtainable and a higher resolution can be expected.

Further, it is preferable that the base resin contains at least one or more kinds of repeating units each represented by the following general formula (9) and repeating units each represented by the following general formula (6'):

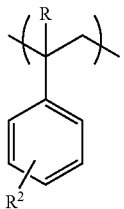

(9)

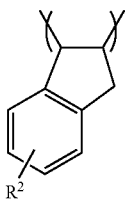

(6')

wherein,

R represents a hydrogen atom or a methyl group; and $R^2$ represents a hydrogen atom, a hydroxyl group, a linear, branched, or cyclic alkyl group having 1 to 10 carbon atoms, a linear, branched, or cyclic alkoxy group having 1 to 10 carbon atoms and being uneliminatable by an acid, or a linear, branched, or cyclic acyl group having 1 to 10 carbon atoms and being uneliminatable by an acid;

wherein $R^2$ may be selected in multiple kinds.

In this way, when the base resin contains at least one or more kinds of repeating units each represented by the general formula (9) and repeating units each represented by the general formula (6'), it is enabled to readily and exemplarily adjust a resolution, a pattern profile, and the like by virtue of selection of $R^2$; such that, when $R^2$ is made to be a group which does not provide a hydroxyl group before and after exposure, the repeating units possess a role to control a solubility of the base resin in an alkaline developer, and simultaneously therewith, allow for enhancement of the rigidity of the resist and for restriction of swelling of the resist upon development, thereby improving a resolution and an etching resistance; and such that, when $R^2$ is made to be a hydroxyl group, it is enabled to improve a close contact property of a resist onto a substrate and a solubility of the resist in a developer.

Further, it is preferable that the composition includes, as the acid generator as the component (B), an acid generator represented by the following general formula (10):

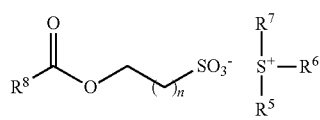

(10)

wherein, $R^5$, $R^6$, and $R^7$ each independently represent a substituted or unsubstituted linear or branched alkyl group, alkenyl group, or oxoalkyl group having 1 to 10 carbon atoms, or a substituted or unsubstituted aryl group, aralkyl group, or aryloxoalkyl group having 6 to 18 carbon atoms, or any two or more of $R^5$, $R^6$, and $R^7$ may be bonded to each other through a single bond or through an ether bond via oxygen atom, to form a ring together with the sulfur atom in the formula;

$R^8$ represents an aromatic ring, or a monovalent hydrocarbon group having an alicyclic hydrocarbon structure having 5 or more carbon atoms; and "n" represents an integer of 1 to 3.

In this way, the resist film based on the resist composition adopting the acid generator represented by the above general formula (10) provides rectangular pattern profile in pattern formation, so that the resist film is favorable not only for a higher resolution but also for an etching resistance.

Moreover, it is preferable that the composition includes, as the basic component as the component (C), at least one or more kinds of amine compounds and amine oxide compounds, each having at least a carboxyl group and each having no hydrogen atoms covalently bonded to a nitrogen atom as a basicity center.

In this way, by adopting, as the basic component as the component (C), at least one or more kinds of amine compounds and amine oxide compounds, each having a carboxyl group and each having no hydrogen atoms covalently bonded to a nitrogen atom as a basicity center, it is enabled to strongly restrict footing profile at a substrate-side boundary face of a resist, so that this effect is favorable for pattern formation on a nitride film such as SiN, TiN, and the like, and the resist is particularly favorably used for pattern formation on a chromium compound film of a mask blank where footing profile tends to occur more likely than the nitride films.

In this case, it is preferable that the composition includes, as the amine compounds and amine oxide compounds, each having a carboxyl group and each having no hydrogen atoms covalently bonded to a nitrogen atom as a basicity center, at least one or more kinds of compounds represented by the following general formulae (11) to (13), respectively:

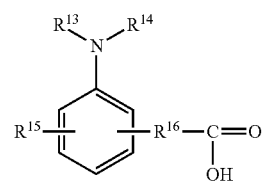

(11)

wherein, $R^{13}$ and $R^{14}$ represent each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthio-alkyl group having 1 to 10 carbon atoms;

$R^{13}$ and $R^{14}$ may be bonded to each other to form a ring structure;

$R^{15}$ represents a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, an alkylthio-alkyl group having 1 to 10 carbon atoms, a halogen atom, or a hydroxyl group; and may form a ring together with a carbon to which $R^{15}$ is bonded and together with another carbon adjacent to the carbon; and $R^{16}$ represents a single bond, or a linear, branched, or cyclic alkylene group having 1 to 20 carbon atoms, or an arylene group having 6 to 20 carbon atoms, which group may include one or several hydroxyl groups, carboxyl groups, carbonyl groups, and the like;

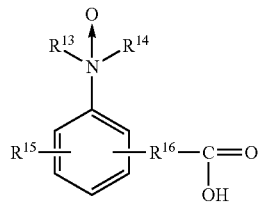

(12)

wherein, $R^{13}$, $R^{14}$, $R^{15}$, and $R^{16}$ are the same as the above; and

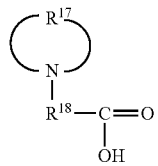

(13)

wherein, $R^{17}$ represents a linear or branched substitutable alkylene group having 2 to 20 carbon atoms, wherein the alkylene group may include, between its carbon atoms, one or several carbonyl groups, ether groups, ester groups, and sulfides; and $R^{18}$ represents a linear, branched, or cyclic alkylene group having 1 to 20 carbon atoms, or an arylene group having 6 to 20 carbon atoms.

In this way, the composition includes, as the amine compounds and amine oxide compounds, each having a carboxyl group and each having no hydrogen atoms covalently bonded to a nitrogen atom as a basicity center, at least one or more kinds of compounds represented by the above general formulae (11) to (13), respectively, thereby enabling to achieve a pattern profile exhibiting a higher resolution and providing pattern profile excellent in perpendicularity at a substrate-side boundary face of the resist.

Further, the present invention provides a resist pattern forming process for forming a resist pattern by lithography, comprising at least the steps of:

forming a resist film on a targeted substrate, by using the positive resist composition;

exposing the resist film to a high energy beam; and developing the resist film by an alkaline developer, to obtain a resist pattern.

By adopting such a resist pattern forming process of the present invention, it is enabled to obtain a fine resist pattern being capable of restricting occurrence of bridges at space areas and being less in defects, even in formation of a pattern of 50 nm line-and-space.

Further, it is possible that a photomask blank is used as the targeted substrate. Moreover, it is preferable that the photomask blank has an outermost obverse layer having a chromium compound film deposited thereon.

One photomask affects performances of all semiconductors produced by using the photomask, so that the photomask is required to possess a higher resolution. Further, such a photomask is also required to possess an enhanced etching resistance, because the photomask is used in etching for a film exhibiting a relatively lower etching rate, such as a silicon compound film and transition metal compound film deposited by sputtering and containing a transition metal(s); and particularly a chromium compound film. Thus, the resist pattern forming process such as provided by the present invention is favorably used.

As explained above, adopting the positive resist composition of the present invention enables to form an excellent pattern having an enhanced etching resistance and an excellent resolution even at a substrate-side boundary face of the resist, in photolithography for fine processing, and particularly in lithography adopting, as an exposure source, KrF laser, extreme ultraviolet rays, electron beam, X-rays, or the like.

DETAILED DESCRIPTION OF THE PREFERRED EMBODIMENTS

Although embodiments of the present invention will be explained hereinafter in detail, the present invention is not limited thereto.

As described above, the method to adopt, as a polymer for a chemically amplified positive resist, a base resin which mainly contains as repeating units a hydroxystyrene unit and a styrene unit having a hydroxyl group protected by an acid labile group such that the polymer insoluble or hardly soluble in an alkaline developer is turned to be soluble in alkali when the acid labile group is reacted with an acid and eliminated thereby, has been utilized for a resist polymer for electron beam exposure, extreme ultraviolet rays exposure, or the like, even after the most-advanced lithography technique has been shifted to ArF from ultraviolet rays. Further, such a method has succeeded in forming a fine pattern having an excellent profile of 80 nm by electron beam exposure based on a resist film thickness of 240 nm, as described in Japanese Patent Laid-open (Kokai) No. 2008-249762, for example.

However, attempt to form a pattern having a minimum line width of 50 nm or less based on a resist film decreased in thickness by adopting the chemically amplified resist composition which has attained the high-resolution as noted above and which is modified in concentration only, has resulted in occurrence of a problem of collapse of fine pattern profile, or a problem of formation of bridges between pattern lines, thereby failing to achieve a higher resolution. The present inventors have established a working hypothesis that the reason to obstruct the higher resolution resides in a lack of mechanical strength of such a resist film at the time of development thereof by an alkaline developer.

As such, based on the above hypothesis, the present inventors have envisaged an adoption of a polymer having a rigid structure as a base resin, and have resultingly tried to use an acenaphthylene unit as a main monomer unit constituting a polymer instead of a styrene unit so as to obtain a more rigid base resin. Further, the present inventors have found out that occurrence of bridges can be prevented by notably increasing an introduction amount of repeating units having acenaphthylene derivatives as units for increasing a rigidity of a polymer up to 70 mole % or more, as compared to conventionally tried introduction amounts (about 40 mole % or less). This rigid polymer is high in carbon density per unit; so that the polymer is enhanced in etching resistance, and the polymer advantageously allows for usage of a resultant resist film at a small thickness to thereby advantageously attain a pattern formation with higher resolution.

Incidentally, although the adoption of a monomer such as indene and acenaphthylene as noted above was convincing for an enhanced etching resistance because the monomer is capable of introducing cyclic structures into a main chain of the polymer by polymerization, it has been uncertain about quality control of a polymer to be obtained. Namely, as seen in examples of Japanese Patent Laid-open (Kokai) No. 2008-249762, upon polymerization of an indene derivative and a hydroxystyrene derivative, those units derived from the indene derivative included in a polymer obtained by the polymerization are extremely less in amount relative to an added amount of indene derivative monomers used for the polymerization. Further, as seen in examples of Japanese Patent Laid-open (Kokai) No. 2004-149756, considerable differences are seen in ratios between used monomer amounts and repeating unit amounts included in polymers obtained by polymerization, depending on kinds of substitutional groups, even in the case of polymerization by indene derivatives only. As such, when prevailing repeating units of a polymer such as 50 mole % or more of repeating units are to be provided by indene derivatives, it is very likely that quality differences, i.e., differences among ratios between repeating units included in obtained polymers, are brought about among polymers, such as those obtained at an initial stage of polymerization and those obtained at a later stage of polymerization. Further, Japanese Patent Laid-open (Kokai) No. 2003-246825 has disclosed that variances of polymerization are seen even among (meth)acrylic acid derivatives and such variances bring about problems of resist performances, and it is thus strongly suggested that adoption of polymers entailing such variances into resist compositions for forming extremely fine patterns such as demanded presently, results in a risk of a problem occurrence of residues due to partial solubilities in pattern formation. Thus, designing in the case of adopting a compound, such as indene which is a polycyclic compound comprising an aromatic ring and a non-aromatic ring and in which a double bond to be involved in polymerization is included in the non-aromatic ring, has been mainly conducted in such a manner that: those repeating units, which play an important role in resolution-related functions, are provided by monomers such as hydroxystyrene derivatives capable of being stably polymerized, while units such as indene are to be introduced only in an amount required to enhance an etching resistance.

Meanwhile, even when the repeating units to be used in the above manner are unsuitable for copolymerization, it is possible to design a base resin for a positive resist in a manner to once obtain a homopolymer by polymerization of hydroxy-indene similarly to polyhydroxystyrene obtained by adopting hydroxystyrenes, and then to protect part of phenolic hydroxyl groups of the homopolymer by acid labile groups, respectively, to thereby use the resultant polymer for a positive resist. However, the indenes are low in polymerization yield due to a relatively poor polymerizing ability of indene structures as noted above, thereby bringing about not only a problem of an increased cost of materials but also a problem of difficulty in lowering a molecular weight dispersity of the resin to be obtained. Increase of such a dispersity brings about an undesirable affection on a line edge roughness (LER), thereby causing a considerable problem in such a case to intend to form a pattern of 50 nm or less.

Nonetheless, the present inventors have further promoted an investigation including study of polymerizing ability of monomers in copolymerization from the above standpoint in this opportunity, and the present inventors have found out that considerable discrepancies are not caused between a charged monomer amount and an amount of repeating units introduced into a polymer, in the case of an acenaphthylene derivative, by exemplarily and mixingly using two or more kinds of monomers having different substitutional groups in a manner to cause them to act as main constituent components, or by exemplarily conducting copolymerization of the acenaphthylene derivative with a monomer unit having an auxiliary function such as a monomer of styrene derivative. This fact means that it is possible to control a quality of a polymer in the case of exemplarily adopting an acenaphthylene derivative, insofar as by designing the polymer in a manner to assign a main function to such a polycyclic compound which comprises an aromatic ring and a non-aromatic ring and in which a double bond to be involved in polymerization is included in the ring upon copolymerization. It has been further revealed that acenaphthylene derivatives are substantially free of difficulty in lowering a molecular weight dispersity of a polymer to be obtained by polymerization, unlike the difficulty in lowering the dispersity, which has been seen in the case of polymerization of indene derivatives for obtaining a homopolymer.

As such, the present inventors have obtained a polymer for a positive resist, by homopolymerization or copolymerization of: a mixture of acenaphthylene derivatives containing, as a main constituent component (70 mole % or more), an acenaphthylene derivative having a hydroxyl group as a functional group, or an acenaphthylene derivative having, as a functional group, a hydroxyl group, and a protected hydroxyl group or the like; or a monomer mixture of acenaphthylene derivative additionally containing a small amount of styrene derivative, methacrylic acid ester, and the like, as a monomer having an auxiliary function; have used the obtained polymer to obtain a positive resist composition, and have resultingly found out that a resist film is obtainable which has a higher resolution and is free of occurrence of a problem of bridges, to thereby carry out the present invention.

Note that the above-mentioned working hypothesis is merely provided to explain the progression leading to the present invention, and never restricts the scope of right of the present invention.

Namely, the present invention provides a positive resist composition comprising at least:

(A) a base resin, which has acidic functional groups protected by acid labile groups, respectively, and is insoluble or hardly soluble in alkali, and which is turned to be soluble in alkali upon elimination of the acid labile groups;

(B) an acid generator; and (C) a nitrogen-containing compound as a basic component;

wherein the base resin is: a polymer containing repeating units each represented by the following general formula (1); or a polymer containing repeating units each represented by the general formula (1), and containing at least one or more kinds of repeating units each represented by the following general formula (2) and repeating units each represented by the following general formula (3); and wherein the base resin contains the repeating units represented by the general formulae (1), (2), and (3), respectively, at a sum ratio of 70 mole % or more relative to a total amount of all repeating units constituting the base resin:

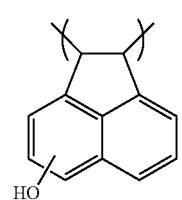

(1)

-continued

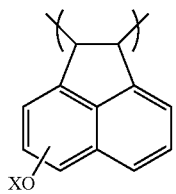
(2)

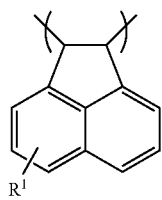
(3)

wherein,

X represents an acid labile group; and

R¹ represents a hydrogen atom, a halogen atom, a linear, branched, or cyclic alkyl group having 1 to 10 carbon atoms, a linear, branched, or cyclic alkoxy group having 1 to 10 carbon atoms and being uneliminatable by an acid, or a linear, branched, or cyclic acyl group having 1 to 10 carbon atoms and being uneliminatable by an acid;

wherein X and R¹ may be selected in multiple kinds, respectively.

In this way, the polymer to be used as the base resin is: a polymer containing repeating units each represented by the above general formula (1); or a polymer containing repeating units each represented by the general formula (1), and containing at least one or more kinds of repeating units each represented by the above general formula (2) and repeating units each represented by the above general formula (3); and the base resin contains the repeating units represented by the general formulae (1), (2), and (3), respectively, at a sum ratio of 70 mole % or more relative to a total amount of all repeating units constituting the base resin. This enables to introduce the cyclic structures into main chains of the polymer, respectively, to make the polymer to have a rigid structure. Further, by using the thus obtained polymer as the base resin to thereby prepare a positive resist composition, the positive resist composition is enabled to form a resist film which is enhanced in etching resistance and which has a higher resolution.

Further, the monomers having acenaphthylene structures such as represented by the general formulae (1) to (3), respectively, are capable of avoiding occurrence of considerable discrepancies between usage amounts of the adopted monomers and a copolymerization composition ratio, thereby avoiding a difficulty in lowering a molecular weight dispersity of the polymer to be obtained by polymerization.

In the following, the base resin, which has acidic functional groups protected by acid labile groups, respectively, and is insoluble or hardly soluble in alkali, and which is turned to be soluble in alkali upon elimination of the acid labile groups, will be explained first, as the component (A) to be used in the positive resist composition of the present invention.

The base resin as the component (A) to be used in the positive resist composition of the present invention is: a polymer containing repeating units each represented by the following general formula (1); or a polymer containing repeating units each represented by the general formula (1), and containing at least one or more kinds of repeating units each represented by the following general formula (2) and repeating units each represented by the following general formula (3); and wherein the base resin contains the repeating units represented by the general formulae (1), (2), and (3), respectively, at a sum ratio of 70 mole % or more relative to a total amount of all repeating units constituting the base resin:

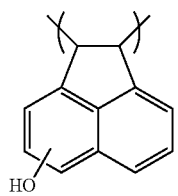
(1)

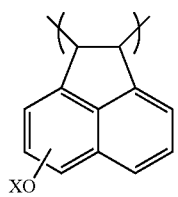
(2)

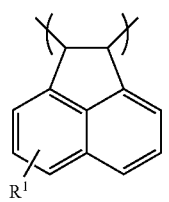
(3)

wherein,

X represents an acid labile group; and

R¹ represents a hydrogen atom, a halogen atom, a linear, branched, or cyclic alkyl group having 1 to 10 carbon atoms, a linear, branched, or cyclic alkoxy group having 1 to 10 carbon atoms and being uneliminatable by an acid, or a linear, branched, or cyclic acyl group having 1 to 10 carbon atoms and being uneliminatable by an acid;

wherein X and R¹ may be selected in multiple kinds, respectively.

As described above, the acenaphthylene derivative units as the repeating units constituting the base resin are contained therein in the amount of 70 mole % or more to thereby cause the base resin to exhibit an enhanced etching resistance and to possess a rigidity, thereby preventing formation of bridges in fine spaces in a development step upon formation of a pattern.

The acid labile group represented by X is an acid-reactive protecting group for a hydroxyl group, such that the bond is cleaved by the aid of acid as a catalyst produced from the acid generator in the resist film. The repeating units having acidic functional groups protected by the acid labile groups, respectively, exhibit a poor solubility in an aqueous alkaline developer before reaction of the acid labile groups with an acid, and the acid labile groups are eliminated by reaction with an acid so that the repeating units are made to exhibit a solubility in the developer. Specifically, those acid labile groups which belong to acetal groups, tertiary alkyl groups, t-butoxycarbonyl groups, or the like are typically used, and many known examples are present (as exemplified in Japanese Patent Laid-open (Kokai) Nos. 2004-149756 and 2006-169302, for example) which may be appropriately selected and used. It is also possible to adopt different acid labile groups in a combined manner. This is also applicable to acid labile groups Y and Z to be described later.

$R^1$ represents a hydrogen atom, a halogen atom, a linear, branched, or cyclic alkyl group having 1 to 10 carbon atoms, a linear, branched, or cyclic alkoxy group having 1 to 10 carbon atoms and being uneliminatable by an acid, or a linear, branched, or cyclic acyl group having 1 to 10 carbon atoms and being uneliminatable by an acid; and the repeating units are each substituted with this group $R^1$ to exhibit an effect to restrict a dissolution rate of the resultant resin in a developer.

Although the resin as the component (A) of the positive resist composition of the present invention contains the acenaphthylene units at the ratio of 70 mole % or more relative to the all repeating units so as to obtain a higher resolution and an enhanced etching resistance as mentioned above, it is possible to adopt variously combined formulations of repeating units constituting the resin.

It is possible that the base resin is configured to contain the acenaphthylene derivatives represented by the above general formula (2), as the repeating units having the acidic functional groups protected by the acid labile groups, respectively, in a manner that all the constitutional units are provided by the acenaphthylene derivatives represented by the general formulae (1) to (3), respectively. However, the base resin may be a resin configured to contain, as the repeating units having the acidic functional groups protected by the acid labile groups, respectively, at least one or more kinds of the repeating units each represented by the following general formula (4), repeating units each represented by the following general formula (5), and repeating units each represented by the following general formula (6), such as in the case of intending to slightly lower the rigidity of the resultant resin so as to adjust a resolution, a pattern profile, and the like of the resin, or in the case of adjusting other reactivities of the resin:

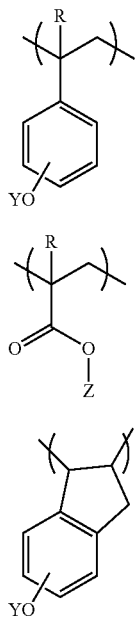

wherein,
Y and Z each represent an acid labile group; and
R represents a hydrogen atom or a methyl group;

wherein Y, Z, and R may be selected in multiple kinds, respectively.

Examples of the repeating units of the general formulae (4) to (6) include those preferably usable ones numerously described in Japanese Patent Laid-open (Kokai) Nos. 2004-149756 and 2006-169302, and it is basically possible to adopt any one of them.

Similarly to the case of the aforementioned acenaphthylene derivative repeating units, it is possible here as well to obtain an alkaline solubility of the resin by the repeating units having hydroxyl groups in aromatic rings thereof, respectively, such that the repeating units have aromatic rings having hydroxyl groups protected by acid labile groups, respectively, to make the resin insoluble or hardly soluble in alkali, and the resin is turned to be soluble in alkali upon conduction of elimination reaction of the protective groups (acid labile groups) by the aid of acid.

Among the repeating units of the general formula (5), those represented by the following general formula (5-1) are preferable subsidiary components, because such repeating units, as (meth)acrylic acid ester units protected by tertiary alkyl groups acting as acid labile groups, respectively, exhibit a higher reactivity with an acid and tend to provide a higher resolution:

wherein,
R represents a hydrogen atom or a methyl group; and
$Z^1$ is selected from groups represented by the following general formulae (7) and (8), respectively:

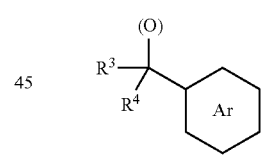

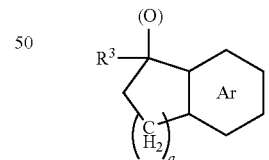

wherein,

represents a substituted or unsubstituted aromatic hydrocarbon group;
$R^3$ represents a linear, branched, or cyclic alkyl group having 1 to 12 carbon atoms; and $R^4$ represents a hydrogen atom, a linear, branched, or cyclic alkyl group having 1 to 12 carbon atoms, or an aromatic hydrocarbon group; or $R^3$ and $R^4$ may cooperatively form a ring together with a carbon atom to which they are bonded, and in that case, $R^3$ and $R^4$ cooperatively represent an alkylene group having 4 to 12 carbon atoms;

"a" represents 1 or 2; and (O) represents an oxygen atom of a carboxyl group and is depicted to indicate a bonded position of each of the groups of the general formulae (7) and (8), respectively.

Particularly, combining the above repeating units with those repeating units of general formula (2) where X as the acid labile group is an acetal group, allows for obtainment of a higher resolution.

Further, the selection of the repeating units and acid labile groups is appropriately and differently designed, depending on a usage scheme of the resist film. Particularly, in case that the positive resist composition of the present invention is to use a combination of multiple kinds of repeating units so as to form an intended fine pattern, it is preferable that: the base resin contains at least repeating units of the general formulae (2), (4), and (5-1) in addition to those of the general formula (1), the acid labile group X is an acetal group, and the acid labile group Y is a tertiary alkyl group having 4 to 15 carbon atoms, as a selection of repeating units having acidic functional groups protected by acid labile groups, respectively, and as a selection of acid labile groups to be used therefor. This combination allows for obtainment of a preferable contrast and expectation of an even higher resolution.

Moreover, the base resin as the component (A) of the positive resist composition of the present invention may further contain at least one or more kinds of repeating units each represented by the following general formula (9) and repeating units each represented by the following general formula (6'), so as to exemplarily adjust a close contact property of a resist onto a substrate and a solubility of the resist in a developer:

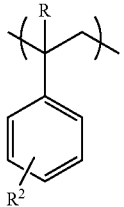

(9)

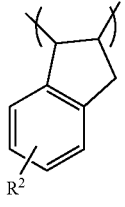

(6')

wherein,

R represents a hydrogen atom or a methyl group; and $R^2$ represents a hydrogen atom, a hydroxyl group, a linear, branched, or cyclic alkyl group having 1 to 10 carbon atoms, a linear, branched, or cyclic alkoxy group having 1 to 10 carbon atoms and being uneliminatable by an acid, or a linear, branched, or cyclic acyl group having 1 to 10 carbon atoms and being uneliminatable by an acid;

wherein $R^2$ may be selected in multiple kinds.

The repeating units represented by the above general formulae (9) and (6') are capable of exemplarily adjusting the close contact property of a resist onto a substrate and the solubility of the resist in a developer, by means of selection of $R^2$, as noted above.

Although the above resin as the component (A) of the positive resist composition of the present invention contains the acenaphthylene units at the ratio of 70 mole % or more relative to the all repeating units so as to obtain a higher resolution and an enhanced etching resistance, it is possible to adopt variously combined formulations of repeating units constituting the resin.

For example, it is possible for the composition to contain, as repeating units for constituting the base resin: repeating units including aromatic rings substituted with unprotected hydroxyl groups, i.e., the repeating units represented by the general formula (1) and those repeating units represented by the general formulae (9) and (6') where $R^2$ is a hydroxyl group, so as to exemplarily enhance the close contact property of a resist onto a substrate and the solubility of the resist in a developer; or repeating units having acidic functional groups protected by acid labile groups, respectively, i.e., the repeating units represented by the general formulae (2), (4), (5), (5-1), and (6), respectively, so as to vary a solubility of a resist in an developer upon exposure of the resist.

As a specific introduction amount of the repeating units, the acenaphthylene derivative repeating units having hydroxyl groups as represented by the general formula (1) is preferably included in the resin at a ratio between 60 mole % and 90 mole % relative to a total amount of all repeating units constituting the resin. Resists adopting polymers including such repeating units at a ratio of 60 mole % or more are free of possibilities of defect occurrence after development, and resists at a ratio of 90 mole % or less are free of excessively enhanced alkaline dissolution rates at unexposed areas and free of problems in pattern formation.

The acenaphthylene derivative repeating units having hydroxyl groups protected by acid labile groups, respectively, represented by the general formula (2) are made different depending on sizes, lipophilicities, and the like of the acid labile groups to be used. However, as a rough standard, inclusion amounts of 5 mole % to 30 mole % of such repeating units relative to all the constituting units, are free of deteriorated resolutions, and possibilities of defect occurrence after development.

Those repeating units having aromatic rings not providing hydroxyl groups before and after exposure, i.e., the repeating units represented by the general formula (3) and the repeating units represented by the general formulae (9) and (6') where $R^2$ is other than a hydroxyl group, possess a role to control a solubility of the base resin in an alkaline developer, and simultaneously therewith, to enhance the rigidity of the resultant resist and restrict swelling thereof upon development, thereby contributing to improvement of resolution and etching resistance. Further, controlling the introduction ratio of the repeating units brings about an effect to enhance a resist contrast. Only, 15 mole % or less is preferable, so as to restrict occurrence of defects after development.

Although the resin is deteriorated in etching resistance, rigidity, and the like by introduction of the styrene derivative repeating units represented by the general formula (4) and those represented by the general formula (9) where $R^2$ is a hydroxyl group, or the methacrylic acid ester derivative repeating units represented by the general formulae (5) and (5-1), such introduction is sometimes advantageous for improvement of an LER (line edge roughness). As such, from both standpoints of the advantage noted just above and the effect of the present invention, the introduction amount of such repeating units is to be 30 mole % or less, preferably 15 mole % or less, and more preferably 10 mole % or less relative to a total amount of all repeating units constituting the resin.

The synthesis of the aforementioned resin as the component (A) of the positive resist composition of the present invention, which resin has acidic functional groups protected by acid labile groups, respectively, and is insoluble or hardly soluble in alkali, may be conducted by appropriate one of homopolymerization and copolymerization, and the merit of usage of acenaphthylene can be provided in both cases as mentioned above.

The polymerization can be readily conducted, by any of known polymerization methods such as disclosed in Japanese Patent Laid-open (Kokai) Nos. 2004-149756 and 2006-169302. Particularly, for polymerization of repeating units in each polymer molecule with a more homogeneous selectivity, i.e., with a more random selectivity as an important aspect in copolymerization, radical polymerization is advantageous which allows for conduction of stable polymerization with a higher yield even in the case of the present invention where 70 mole % or more of the monomer mixture to be used for polymerization is provided by acenaphthylene derivatives.

Although hydroxyacenaphthylene units having hydroxyl groups are usable for copolymerization without protecting the hydroxyl groups thereof in synthesis of a polymer having the hydroxyacenaphthylene units, it is efficient in some cases to polymerize protected monomers of the units, followed by deprotection, in removing metal impurities, for example. Although detailed explanation is not provided for protection and deprotection of phenolic hydroxyl groups upon polymerization because the procedure in the case of hydroxystyrene is widely known, such protection and deprotection can be conducted by known methods configured to adopt protection by acyl group or protection by acetal (see Japanese Patent Laid-open (Kokai) Nos. 2004-149756, 2006-169302 and 2002-234910).

In turn, concerning introduction of acid labile groups, although acid labile groups may be directly introduced into a resin by adopting monomers protected by acid labile groups at the time of polymerization in the case of the repeating units represented by the general formulae (2), (4), (5), (5-1), and (6), respectively, it is also possible to adopt a method for conducting modification after polymerization, insofar as for the repeating units having hydroxyl groups each represented by the general formula (1) or for the repeating units each represented by the general formulae (9) or (6') where $R^2$ is a hydroxyl group. Numerous examples are known for this method as well, and it is exemplarily possible to adopt methods described in Japanese Patent Laid-open (Kokai) Nos. 2004-149756, 2006-169302, and the like.

The resin as the component (A) of the positive resist composition of the present invention is to preferably have a mass-average molecular weight of 1,000 to 50,000 (measurement is conducted by HLC-8120GPC by TOSOH CORPORATION; based on a gel permeation chromatography using polystyrene as a standard sample), so as to obtain a preferable resolution.

Mass-average molecular weights of 1,000 or more attain sufficient heat resistances of the positive resist compositions, and mass-average molecular weights of 50,000 or less avoid deterioration of resolutions of resist patterns and occurrence of defects of resist patterns after development.

Further, when the molecular weight distribution (Mw/Mn) of the copolymer in the base resin to be used in the positive resist composition of the present invention is narrow, there is a less possibility that extraneous substances are found on patterns, or that pattern shapes are deteriorated after exposure, due to presence of polymers having lower molecular weights and/or higher molecular weights. Since the influence of the molecular weight and molecular weight distribution tends to be increased as pattern rules are made finer, it is preferable that the molecular weight distribution of the polymer to be used is 2.5 or less, and particularly 1.8 or less, and is thus low in dispersibility, so as to obtain a resist material to be preferably used for fine pattern dimensions.

As to the acid generator as the component (B) in the positive resist composition of the present invention, any heretofore known acid generators usable in a chemically amplified resist (for example, Japanese Patent Laid-Open (kokai) Nos. 2008-249762, 2004-149750 and 2006-169302) can be used basically.

As to the suitable photo acid generator, the photo acid generators with a type including a sulfonium salt, an iodonium salt, a sulfonyl diazomethane, and an N-sulfonyl oxyimide may be mentioned, and they may be used singly or in a combination of two or more kinds. Examples of preferable counter anions possessed by the sulfonic acids generated from the foregoing salts or compounds include a benzene sulfonic acid anion, a toluene sulfonic acid anion, a 4-(4-toluenesulfonyloxy)benzene sulfonic acid anion, a pentafluorobenzene sulfonic acid anion, a 2,2,2-trifluoroethane sulfonic acid anion, a nonafluorobutane sulfonic acid anion, a heptadecafluorooctane sulfonic acid anion, and a camphor sulfonic acid anion.

Although the addition amount of the acid generator as the component (B) in the positive resist composition of the present invention is not particularly limited, such an acid generator is to be preferably added in an amount of 0.4 to 20 parts by mass, more preferably 0.8 to 15 parts by mass relative to 100 parts by mass of the base resin as the component (A).

Here, it is possible to expect assurance of sensitivity and improvement of resolution, by simultaneously increasing the addition amount of the acid generator and the addition amount of the basic component (C) to be described later. Typically, addition amounts of 20 parts by mass or less of the acid generator as the component (B) allows for efficient obtainment of a sensitivity improving effect, thereby avoiding a possibility of unecononomical nature. Further, addition amounts of 0.4 part by mass or more eliminate a necessity to decrease the basic component down to a smaller amount so as to satisfy the demanded sensitivity, thereby avoiding a possibility that the resolution of a formed resist pattern is deteriorated.

Particularly, when the resist composition is used to form a resist film for irradiation of radiation or irradiation of electron beam thereto, addition of an acid generator is not problematic in energy attenuation of irradiated radiation within a resist film though higher sensitivity is scarcely obtained then, so that the addition amount of the acid generator is made to be a higher concentration such as preferably about 2.0 to 20 parts by mass, as compared to a situation of adoption of excimer laser light.

Further, among the acid generators, acid generators represented by the following general formula (10) are especially preferably used.

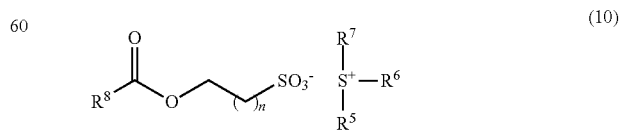

(10)

(In the formula, $R^5$, $R^6$, and $R^7$ each independently represent a substituted or unsubstituted linear or branched alkyl group, alkenyl group, or oxoalkyl group having 1 to 10 carbon atoms, or a substituted or unsubstituted aryl group, aralkyl group, or aryloxoalkyl group having 6 to 18 carbon atoms, or any two or more of $R^5$, $R^6$, and $R^7$ may be bonded to each other through a single bond or through an ether bond via oxygen atom, to form a ring together with the sulfur atom in the formula;

$R^8$ represents an aromatic ring, or a monovalent hydrocarbon group having an alicyclic hydrocarbon structure having 5 or more carbon atoms; and "n" represents an integer of 1 to 3.

In the case of triphenylsulfonium-"substituted-benzenesulfonate" which is typically used in a resist for electron beam, although a resolution is excellent when the acid is low in diffusion, the reactivity is rather lowered then to bring about a drawback of a weakened sensitivity. Nonetheless, it has been shown that the acid generator represented by the general formula (10) allows for obtainment of rectangular pattern lines in profile with a higher resolution and allows for possession of a higher sensitivity by a resist. Although the reason of this advantage has not been clarified yet, it is supposed that this advantage is related to the represented structure where the carboxylic acid ester is provided instead of alkylsulfonate. The same effect is obtainable in the present invention as well, by adopting the acid generator represented by the general formula (10).

Only, since it has been known that a dissolution inhibiting effect of an acid generator is considerably changed depending on a structure of a cation portion of the acid generator, it is preferable to select a structure of an acid generator adaptively to a solubility of a polymer. For example, since it has been known that a solubility of a resist film in an alkaline developer is lowered when an alkyl group is introduced into a benzene nucleus, it is possible to control a solubility of a resist film in alkali by means of the acid generator. When the polymer is to be low in dissolution rate, an acid generator based on a triphenylsulfonium having an alkyl group introduced therein is effective.

As the basic component as the component (C) contained in the positive resist composition of the present invention, basically as in the case of the acid generator noted above, a heretofore known basic component usable in a chemically amplified resist can be used. Examples of them include primary, secondary, and tertiary aliphatic amines, mixed amines, aromatic amines, heterocyclic amines, a nitrogen-containing compound having a carboxyl group, a nitrogen-containing compound having a sulfonyl group, a nitrogen-containing compound having a hydroxyl group, a nitrogen-containing compound having a hydroxyphenyl group, an alcoholic nitrogen-containing compound, an amide derivative, and an imide derivative as enumerated in Japanese Patent Laid-open (kokai) Nos. 2008-249762, 2004-149756 and 2006-169302.

The basic component as the component (C) may be used singly or in a combination of two or more kinds, and its amount is usually 0.01 to 2 parts by mass and particularly preferably 0.01 to 1 parts by mass, relative to 100 parts by mass of the base resin. When the amount is 0.01 to 2 parts by mass, effects of the addition can be obtained, and an excessive decrease in sensitivity can be prevented.

Among the basic component blended as the component (C), the amine compound or the amine oxide compound each having a carboxyl group but not having a hydrogen atom covalently bonded to a nitrogen atom as a basicity center is an especially advantageous material because a problem that in the case that the base resin as the component (A) is used for a positive resist, an unreacted part (so-called footing profile) is formed at the pattern edge near to the substrate when other basic component is used can be solved.

Substrates susceptible to the footing profile like this include nitride substrates such as TiN, SiN, and SiON. The footing can occur very easily especially when its surface is formed of a chromium metal or a chromium compound containing nitrogen and/or oxygen, and thus the foregoing amine or amine oxide compound is extremely effective to solve this problem.

Preferable chemical structure example of the above-mentioned amine compound having a carboxyl group but not having a hydrogen atom covalently bonded to a nitrogen atom as a basicity center are compounds represented by the following general formulae (11) to (13), but are not particularly restricted to these example.

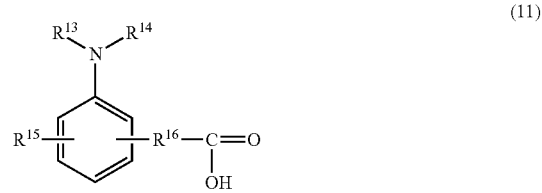

(11)

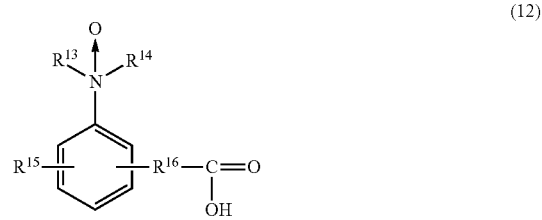

(12)

(13)

(In the formulae, each $R^{13}$ and $R^{14}$ represents a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthioalkyl group having 1 to 10 carbon atoms; $R^{13}$ and $R^{14}$ may form a ring structure by bonding with each other;

$R^{15}$ represents a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, an alkyl thioalkyl group having 1 to 10 carbon atoms, a halogen atom, or a hydroxyl group, and may form a ring together with a carbon to which $R^{15}$ is bonded and together with another carbon adjacent to the carbon;

$R^{16}$ represents a single bond, a linear, branched, or cyclic alkylene group having 1 to 20 carbon atoms, or an arylene group having 6 to 20 carbon atoms, and may contain one or several hydroxyl groups, carboxyl groups, carbonyl groups, and the like;

$R^{17}$ represents an optionally substituted linear or branched alkylene group having 2 to 20 carbon atoms, wherein one or several groups selected from a carbonyl group, an ether group, an ester group, and a sulfide may be contained between the carbon-carbon bond of the alkylene group; and $R^{18}$ represents a linear, branched, or cyclic alkylene group having 1 to 20 carbon atoms, or an arylene group having 6 to 20 carbon atoms.)

In the general formulae (11) to (13), without any limitations, examples of an aryl group having 6 to 20 carbon atoms concretely include a phenyl group, naphthyl group, anthryl group, phenanthryl group, pyrenyl group, naphthacenyl group, and fluorenyl group;

examples of a linear, branched, or cyclic alkyl group having 1 to 20 carbon atoms concretely include a methyl group, ethyl group, propyl group, isopropyl group, butyl group, isobutyl group, t-butyl group, pentyl group, hexyl group, decyl group, cyclopentyl group, cyclohexyl group, and decahydronaphthalenyl group;

examples of an aralkyl group having 7 to 20 carbon atoms concretely include a benzyl group, phenethyl group, phenylpropyl group, naphthylmethyl group, naphthylethyl group, and anthracenylmethyl group;

examples of a hydroxyalkyl group having 2 to 10 carbon atoms concretely include a hydroxymethyl group, hydroxyethyl group, and hydroxypropyl group;

examples of an alkoxyalkyl group having 2 to 10 carbon atoms concretely include a methoxymethyl group, ethoxymethyl group, propoxymethyl group, isopropoxymethyl group, butoxymethyl group, isobutoxymethyl group, tent-butoxymethyl group, tert-amyloxymethyl group, cyclohexyloxymethyl group, cyclopentyloxymethyl group;

examples of an acyloxyalkyl group having 3 to 10 carbon atoms concretely include a formyloxymethyl group, acetoxymethyl group, propionyloxymethyl group, butyryloxymethyl group, pivaloyloxymethyl group, cyclohexane carbonyloxymethyl group, and decanoyloxymethyl group; and examples of an alkylthio-alkyl group having 1 to 10 carbon atoms concretely include a methylthiomethyl group, ethylthiomethyl group, propylthiomethyl group, isopropylthiomethyl group, butylthiomethyl group, isobutylthiomethyl group, t-butylthiomethyl group, t-amylthiomethyl group, decylthiomethyl group, and cyclohexylthiomethyl group.

Further, examples of an arylene group having 6 to 20 carbon atoms concretely include phenylene group, naphthylene group, anthracenylene group, and tetrahydronaphthylene group, without any limitations. Further, examples of an alkylene group having 1 to 20 carbon atoms concretely include a methylene group, methylmethine group, ethylmethine group, propylmethine group, isopropylmethine group, buthylmethine group, sec-buthylmethine group, isobuthylmethine group, 1,2-ethylene group, 1,2-propylene group, 1,3-propylene group, 1,2-butylene group, 1,4-butylene group, 1,2-pentene group, 1,2-hexene group, 1,6-hexene group, 1,2-cyclohexene group, and 1,4-cyclohexylene group, without any limitations.

Preferable examples of the amine compounds represented by the general formula (11) will be concretely enumerated below, without limited thereto.

Namely, such examples include: o-dimethylaminobenzoic acid, p-dimethylaminobenzoic acid, m-dimethylaminobenzoic acid, p-diethylaminobenzoic acid, p-dipropylaminobenzoic acid, p-diisopropylaminobenzoic acid, p-dibutylaminobenzoic acid, p-dipentylaminobenzoic acid, p-dihexylaminobenzoic acid, p-diethanolaminobenzoic acid, p-diisopropanolaminobenzoic acid, p-dimethanolaminobenzoic acid, 2-methyl-4-diethylaminobenzoic acid, 2-methoxy-4-diethylaminobenzoic acid, 3-dimethylamino-2-naphthalene acid, 3-diethylamino-2-naphthalene acid, 2-dimethylamino-5-bromobenzoic acid, 2-dimethylamino-5-chlorobenzoic acid, 2-dimethylamino-5-iodobenzoic acid, 2-dimethylamino-5-hydroxybenzoic acid, 4-dimethylaminophenylacetic acid, 4-dimethylaminophenylpropionic acid, 4-dimethylaminophenylbutyric acid, 4-dimethylaminophenylmalic acid, 4-dimethylaminophenylpyruvic acid, 4-dimethylaminophenyllacetic acid, 2-(4-dimethylaminophenyl)benzoic acid, and 2-(4-(dibutylamino)-2-hydroxybenzoyl)benzoic acid.

Preferable example of the amine oxide compound represented by the general formula (12) is compound obtained by oxidizing each of the amine compounds represented by the general formula (11) and concretely enumerated above, without limited thereto.

Preferable examples of the amine compound represented by the general formula (13) will be concretely enumerated below, without limited thereto.

Namely, examples thereof include 1-piperidinepropionic acid, 1-piperidinebutyric acid, piperidinemalic acid, 1-piperidinepyruvic acid, 1-piperidinelactic acid, and the like.

The amine oxide structure represented by the general formula (12) is to be produced by selecting optimum techniques corresponding to the structures of the compounds, respectively. Examples thereof include a technique to adopt an oxidation reaction using an oxidizing agent for a nitrogen-containing compound, and a technique to adopt an oxidation reaction of a nitrogen containing compound in a diluted solution of hydrogen peroxide, without limited thereto.

Exemplarily described below is a synthesis scheme of an amine oxide compound represented by the general formula (12).

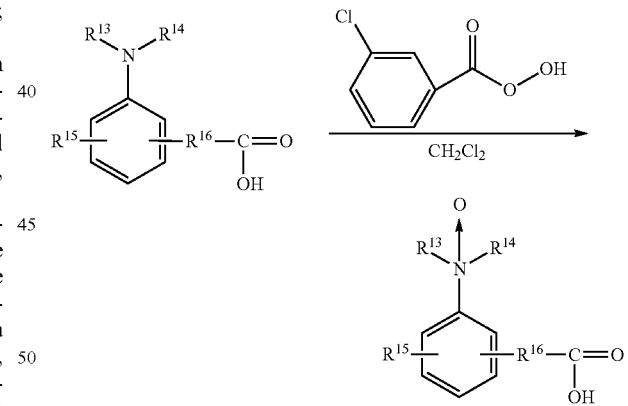

(In the above formula, $R^{13}$, $R^{14}$, $R^{15}$ and $R^{16}$ are same as the above.)

Although this reaction is an oxidation reaction of amine adopting an oxidizing agent (m-chloroperbenzoic acid), this reaction can be conducted by another oxidizing agent in a usual manner of an oxidation reaction. After the reaction, mixed reaction products can be purified by usual manners such as distillation, chromatography, recrystallization, and the like.

When the foregoing amine compound or amine oxide compound each having a carboxyl group but not having a hydrogen atom covalently bonded to a nitrogen atom as a basicity center is used, it is expected that a generated acid is promptly captured by the present functional group substituted to the nitrogen atom, while the carboxyl group is arranged in the substrate side thereby inhibiting the deactivation of the generated acid caused by diffusion to the substrate, and thus that a pattern profile with a high resolution and an excellent verticality at the substrate surface can be obtained.

Accordingly, when the amine compound or the amine oxide compound each having a carboxyl group but not having a hydrogen atom covalently bonded to a nitrogen atom as a basicity center is appropriately tailored based on its physical properties such as volatility, basicity, an acid-capturing rate, and a diffusion rate in the resist, in accordance with a combination with (A) the resist polymer and (B) the acid generator to be used, a further desirable pattern form can be obtained.

In this way, to fully obtain an effect to overcome a problem of footing profile, it is more preferable to adopt a tertiary amine having no hydrogen atoms covalently bonded to a nitrogen atom as a basicity center, rather than amine compounds or amine oxide compounds such as a primary amine which has a hydrogen atom covalently bonded to a nitrogen atom as a basicity center even when the primary amine has a carboxyl group.

Further, it is possible to successfully arrange a carboxyl group at a substrate side to enable to prevent generated acids from diffusing into a substrate and from being inactivated, insofar as by a basic component having no hydrogen atoms covalently bonded to a nitrogen atom as a basicity center, other than those amine compounds or amine oxide compounds such as 2-quinolinecarboxylic acid, nicotinic acid and the like, each being a weak base and each having a nitrogen atom as a basicity center included in an aromatic ring.

Note that the effect of the basic component is obtainable irrespectively of a film thickness, and the basic component provides an advantageous effect also in a case of adopting a resin protected by a tertiary alkyl group for forming a resist film having a thickness of 100 nm or more.

The effect to suppress a footing profile by the amine compound or the amine oxide compound each having a carboxyl group but not having a hydrogen atom covalently bonded to a nitrogen atom as a basicity center is based on the localization to near the substrate owing to the carboxyl group as explained above. Accordingly, in order to obtain its effect, the entire component (C) does not necessarily need to be the amine compound or the amine oxide compound each having a carboxyl group but not having a hydrogen atom covalently bonded to a nitrogen atom as a basicity center. Thus, the foregoing amine compound or amine oxide compound each having a carboxyl group but not having a hydrogen atom covalently bonded to a nitrogen atom as a basicity center can be used in a combination with non-'amine compound or amine oxide compound each having a carboxyl group but not having a hydrogen atom covalently bonded to a nitrogen atom as a basicity center' of a usually used basic component.

Preferable examples of the basic component typically used include the compounds represented by the following general formulae (14) and (15), and many specific examples thereof are exemplified in Japanese Patent Laid-open (kokai) Nos. 2008-249762, 2004-149756 and 2006-169302.

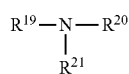
(14)

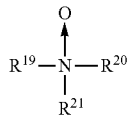
(15)

(In the formulae, $R^{19}$ $R^{20}$ and $R^{21}$ each represent a hydrogen atom, a liner, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 2 to 10 carbon atoms, an alkylthio-alkyl group having 1 to 10 carbon atoms, and any two of $R^{19}$, $R^{20}$, and $R^{21}$ may be bonded to each other to form a ring structure or an aromatic ring.)

When the amine compound or the amine oxide compound each having a carboxyl group but not having a hydrogen atom covalently bonded to a nitrogen atom as a basicity center and other typically used amine compound or amine oxide compound than the amine compound or the amine oxide compound each having a carboxyl group but not having a hydrogen atom covalently bonded to a nitrogen atom as a basicity center are used by mixture, as mentioned above, the blending ratio (mass ratio) of the amine compound or the amine oxide compound each having a carboxyl group but not having an active hydrogen atom to the other amine compound and amine oxide compound is preferably in a range from 100:0 to 10:90.

The positive resist composition of the present invention can be prepared by using an organic solvent, and any organic solvent is usable for preparation insofar as the base resin, acid generator, other additives, and the like are soluble in the organic solvent. Examples of the organic solvents include: ketones such as cyclohexanone and methyl-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tent-butyl acetate, tert-butyl propionate, and propylene glycol mono-tert-butyl ether acetate; and lactones such as γ-butyrolactone; which can be used solely, or mixedly in two or more kinds, without limited thereto. Desirably usable in the present invention are mixed solvents containing, as main solvents: ethyl lactate, propylene glycol monomethyl ether, and the like which are most excellent in solubility for an acid generator in the resist components; propylene glycol monomethyl ether acetate excellent in film-forming ability upon coating; and the like. Particularly and frequently used is a solvent containing 80 mass % or more of a mixture of: one or more kinds selected from ethyl lactate and propylene glycol monomethyl ether; and propylene glycol monomethyl ether acetate; and a solvent component is occasionally added, for adjustment of a boiling point or the like.

For film formation of a thin-film resist in which the positive resist composition of the present invention is favorably used, the usage amount of the organic solvent is preferably 1,000 to 10,000 parts, particularly 2,000 to 9,700 parts relative to 100 parts of a base resin. Adjusting the concentration in this way allows for obtainment of a resist film having a thickness of 10 to 100 nm in a stable manner with an improved flatness, by spin coating.

To improve a coatability of the chemically amplified resist composition of the present invention, it is possible to add thereto a conventional surfactant (D), as an optional component in addition to the above enumerated components. Note that the optional component may be added in an ordinary amount within a range, which does not obstruct the effect of the present invention.

Examples of surfactant (D) include, without particular limitation, polyoxyethylene alkyl ethers such as polyoxyethylene lauryl ether, polyoxyethylene stearyl ether, polyoxyethylene cetyl ether, and polyoxyethylene olein ether;

polyoxyethylene alkyl aryl ethers such as polyoxyethylene octyl phenol ether, and polyoxyethylene nonyl phenol ether;

polyoxyethylene polyoxypropylene block copolymers;

sorbitan fatty acid esters such as sorbitan monolaurate, sorbitan monopalmitate, and sorbitan monostearate;

nonionic surfactants of polyoxyethylene sorbitan fatty acid ester, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate;

fluorinated surfactants such as F TOP EF301, EF303, EF352 (produced by JEMCO Inc.), MEGAFAC F171, F172, F173, R08, R30, R90, R94 (produced by Dai-Nippon Ink & Chemicals, Inc.), Fluorad FC-430, FC-431, FC-4430, FC-4432 (produced by Sumitomo 3M Co., Ltd.), ASAHIGUARD AG710, SURFLON S-381, S-382, S-386, SC101, SC102, SC103, SC104, SC105, SC106, SURFINOL E1004, KH-10, KH-20, KH-30, KH-40 (produced by Asahi Glass Co.);

organosiloxane polymers KP341, X-70-092, X-70-093 (produced by Shin-Etsu Chemical Co., Ltd.); and acrylic or methacrylic POLYFLOW No. 75, No. 95 (produced by Kyoeisha Yushi Kagaku Kogyo Co., Ltd.).

Further, surfactants of fluorinated oxetane ring-opening polymers series are also preferably used, because these surfactants have advantage in small effecting to a coatability of the resist even if the addition amount is changing. For example, PF-636 (produced by Omnova Solutions Inc.) is used. These surfactants can be used solely, or mixedly in two or more kinds.

The addition amount of the surfactant in the positive resist composition of the present invention, is 2 parts by mass or less, and preferably 1 part by mass or less, relative to 100 parts by mass of the base resin (A) in the resist composition.

In the present invention, a resist pattern forming process for forming a resist pattern by lithography, comprising at least the steps of forming a resist film on a targeted substrate, by using the positive resist composition of the present invention; exposing the resist film to a high energy beam; and developing the resist film by an alkaline developer, to obtain a resist pattern can be provided.

In this case, it is preferable to use a photomask blank as the targeted substrate. Further, it is preferable that the photomask blank has an outermost obverse layer having a chromium compound film deposited thereon.

Meanwhile, formation of the resist film with the film thickness of 10 to 100 nm on the targeted substrate by using the positive resist composition of the present invention can be done for any purpose via a step of coating of the resist composition onto the targeted substrate and a step of pre-baking thereafter, wherein any of these steps is carried out by a heretofore known method.

Although there are several known coating methods other than a spin coating method, when a thin film with the resist film thickness of 10 to 100 nm, is formed, it is preferable that the spin coating method is used to obtain a uniform film thickness.

In the case that the targeted substrate is a semiconductor wafer, the coating conditions at the time of spin coating need to be controlled according to the wafer size, an intended film thickness, a composition of the resist composition, and the like. When the film thickness of about 100 nm is intended to be obtained by using an 8-inch wafer, the resist film with a high uniformity can be obtained by rotation with a rotation speed of 4,000 to 5,000 rpm with a time of 40 seconds, after the resist composition is cast on the wafer. The amount of the solvent to be used in preparing the resist composition is 1,400 to 1,600 parts by mass relative to 100 parts by mass of the base resin.

Then, a pre-bake is done in order to remove an excess solvent remained in the resist film obtained by the above manner. In the case that the targeted substrate is a semiconductor wafer, the conditions of the pre-bake are; the temperature of 80 to 130° C. and the time of 1 to 10 minutes usually, and 90 to 110° C. and 3 to 5 minutes more preferably, when the pre-bake is done on a hot plate.

In the case that the targeted substrate is a photomask blank, by the same token, the coating conditions need to be controlled according to the blank size, an intended film thickness, a composition of the resist composition, and the like. When the film thickness of about 100 nm is intended on a square blank of 15.2×15.2 cm, the resist film with a high uniformity can be obtained, after the resist composition is cast on the blank, by rotation with a rotation speed of 1,000 to 3,000 rpm for 2 seconds, and then at the rotation of 800 or less rpm for 30 seconds. The amount of the solvent to be used in preparing a positive resist composition is 2,000 to 9,700 parts by mass relative to 100 parts by mass of the base resin.

Then, a pre-bake is done in order to remove an excess solvent remained in the resist film obtained by the above manner. In the case that the targeted substrate is a photomask blank, the conditions of the pre-bake are; the temperature of 80 to 130° C. and the time of 4 to 20 minutes usually, and 90 to 110° C. and 8 to 12 minutes more preferably, when the pre-bake is done on a hot plate.

Subsequently, the resist film thus obtained is subjected to a pattern exposure to form an intended pattern. The exposure is done, in the case of a semiconductor processing, by covering above the foregoing resist film with a mask to form an intended pattern and using a high energy beam, such as a far-ultraviolet rays, an excimer laser, and an X-ray, or an electron beam, with the exposure amount of 1 to 100 $\mu C/cm^2$ and more preferably 10 to 100 $\mu C/cm^2$. In addition to an ordinary exposure method, the exposure can also be done by an immersion method wherein the space between a projection lens and the resist is immersed in a liquid as appropriate.

In the case of processing a photomask blank, a pattern exposure is usually done by a beam exposure because many of the identical products are not intended to be made by the processing. A high energy beam of an electron beam is generally used, but the foregoing other beams can also be used as the light source by the same token.

After the exposure, a post exposure bake (PEB) is usually done, for example, on a hot plate at 60 to 150° C. for 4 to 20 minutes, preferably at 80 to 140° C. for 8 to 12 minutes, to carry out a chemical amplification reaction by diffusing the acid.

Then, development is done to form an intended pattern on the substrate, by using an aqueous alkaline developer such as tetramethyl ammonium hydroxide (TMAH) with a concentration ranging from 0.1 to 5% by mass, preferably 2 to 3% by mass, with a time ranging from 0.1 to 3 minutes, preferably 0.5 to 2 minutes, and with an ordinary method such as a dip method, a puddle method, and a spray method. In addition, a heat treatment (thermal flow) may be done further, as appropriate, after the development to adjust the pattern size. Incidentally, the positive resist composition of the present invention is most suitably used for fine patterning by a high energy beam, in particular, a far-ultraviolet rays or an excimer laser with the wavelength of 250 to 120 nm, an extreme ultraviolet rays, an X-ray, or an electron beam.

As to the targeted substrate for a lithography to which the positive resist composition of the present invention is applied, any substrate such as, for example, a semiconductor wafer, an intermediate substrate in the semiconductor manufacturing, and a photomask substrate, can be used as far as it uses a lithography by a photoresist, though a substrate having a film formed of a metal compound by a spattering or the like can realize the effects of the present invention advantageously.

Among them, in the case of a photomask blank having an outermost obverse surface formed with a chromium compound film as a light-shielding film or etching mask film, pattern profile control of a resist is difficult at a substrate-side boundary face of resist, so that the effect of the present invention is particularly useful. Examples of chromium compounds as materials at outermost surfaces of substrates to which the present invention is desirably applied, include metal chromium, chromium oxide, chromium nitride, chromium carbide, chromium oxide nitride, chromium oxide carbide, chromium nitride carbide, chromium oxide nitride carbide, and the like.

EXAMPLE

Although the present invention will be specifically explained by describing Synthesis Examples, Comparative Synthesis Examples, Examples, and Comparative Examples, the present invention is not limited to such Examples.

Synthesis Example 1

Poured into a flask of 3 L were 361.2 g of 5-acetoxy-acenaphthylene, and 37.7 g of acenaphthylene, as well as 675 g of toluene as a solvent. This reaction vessel was cooled down to −70° C. in an atmosphere of nitrogen, and repetitively subjected to degasification at a reduced pressure and to a nitrogen flow, three times. After temperature elevation up to a room temperature, 34.7 g of 2,2'-azobis(2,4-dimethylvaleronitrile) (V-65 produced by Wako Pure Chemical Industries, Ltd.) as a polymerization initiator was added into the mixture; after further temperature elevation up to 55° C., reaction was conducted for 40 hours. Dropped into this reaction solution while stirring it, was a mixed solution of 970 g of methanol and 180 g of water; after 30 minutes, the lower layer (polymer layer) was vacuum concentrated; this polymer layer were again dissolved into 0.45 L of methanol and 0.54 L of tetrahydrofuran; 160 g of triethylamine and 30 g of water were added thereto; and the temperature was elevated to 60° C., to conduct a deprotection reaction for 40 hours. This deprotection reaction solution was vacuum concentrated, and 548 g of methanol and 112 g of acetone were added into the concentrated solution to thereby turn it into a solution state. Dropped into the solution while stirring it, was 990 g of hexane; after 30 minutes, 300 g of tetrahydrofuran was added into the lower layer (polymer layer); dropped into it while stirring it, was 1,030 g of hexane; and after 30 minutes, the lower layer (polymer layer) was vacuum concentrated. This polymer solution was neutralized by using 82 g of acetic acid; and the reaction solution was concentrated, then dissolved into 0.3 L of acetone, and precipitated in 10 L of water in the same manner as the above; followed by conduction of filtering and drying, to thereby obtain 248 g of copolymer of polyhydroxyacenaphthylene and acenaphthylene.

Charged into a flask of 1 L were 50.0 g of the copolymer of polyhydroxyacenaphthylene and acenaphthylene, and 400 g of tetrahydrofuran as a solvent. This reaction vessel was cooled down to 5° C. in a nitrogen atmosphere; 31.0 g of triethylamine was added into the mixture; and 14.9 g of the following acetalizing agent-A was thereafter droppedly poured thereinto, over a period of 1 hour; followed by temperature elevation up to a room temperature, and by reaction thereafter for 4 hours. This reaction solution was concentrated, and dissolved in 200 g of acetone; thereafter crystallized and precipitated in a solution of 7.0 L of water, for neutralization washing by acetic acid; and the obtained white solid was filtered, followed by drying at 40° C. under reduced pressure, to obtain 54.0 g of a white polymer.

The obtained polymer was subjected to $^{13}$C, $^{1}$H-NMR, and GPC measurements, thereby obtaining the following analysis results:
Copolymerization composition ratio:
5-hydroxyacenaphthylene:acenaphthylene:5-methoxy-isobutoxy-acenaphthylene=74.9:10.7:14.4
Weight-average molecular weight (Mw)=4,900
Molecular weight distribution (Mw/Mn)=1.62
This polymer was regarded as (Polymer-1).

Synthesis Example 2

The same procedure as Synthesis Example 1 was conducted by using 75.9 g of indene instead of 37.7 g of acenaphthylene in Synthesis Example 1, to obtain 240 g of a copolymer of polyhydroxyacenaphthylene and indene.

Poured into a flask of 1 L were 50.0 g of the copolymer of polyhydroxyacenaphthylene and indene, and 400 g of tetrahydrofuran as a solvent. This reaction vessel was cooled down to 5° C. in a nitrogen atmosphere; 31.0 g of triethylamine was added into the mixture; and 14.9 g of the acetalizing agent-A was thereafter droppedly poured thereinto, over a period of 1 hour; followed by temperature elevation up to a room temperature, and by reaction thereafter for 4 hours. This reaction solution was concentrated, and dissolved in 200 g of acetone; thereafter crystallized and precipitated in a solution of 7.0 L of water, for neutralization washing by acetic acid; and the obtained white solid was filtered, followed by drying at 40° C. under reduced pressure, to obtain 54.0 g of a white polymer.

The obtained polymer was subjected to $^{13}$C, $^{1}$H-NMR, and GPC measurements, thereby obtaining the following analysis results:
Copolymerization composition ratio:
5-hydroxyacenaphthylene:indene:5-methoxyisobutoxy-acenaphthylene=74.3:9.9:15.8
Weight-average molecular weight (Mw)=4,800
Molecular weight distribution (Mw/Mn)=1.76
This polymer was regarded as (Polymer-2).

Synthesis Example 3

The same procedure as Synthesis Example 1 was conducted by using the following acetalizing agent-B instead of the acetalizing agent-A but in an equimolar manner, to acetalize the copolymer of polyhydroxyacenaphthylene and acenaphthylene.

The obtained polymer was subjected to $^{13}$C, $^1$H-NMR, and GPC measurements, thereby obtaining the following analysis results:

Copolymerization composition ratio:
5-hydroxyacenaphthylene:acenaphthylene:5-tricyclodecane-oxyisobutoxy-acenaphthylene=75.4:10.8:13.8
Weight-average molecular weight (Mw)=4,400
Molecular weight distribution (Mw/Mn)=1.68
This polymer was regarded as (Polymer-3).

Synthesis Example 4

The same procedure as Synthesis Example 2 was conducted by using the acetalizing agent-B instead of the acetalizing agent-A but in an equimolar manner, to acetalize the copolymer of polyhydroxyacenaphthylene and indene.

The obtained polymer was subjected to $^{13}$C, $^1$H-NMR, and GPC measurements, thereby obtaining the following analysis results:

Copolymerization composition ratio:
5-hydroxyacenaphthylene:indene:5-tricyclodecane-oxyisobutoxy-acenaphthylene=75.4:10.8:13.8
Weight-average molecular weight (Mw)=4,500
Molecular weight distribution (Mw/Mn)=1.72
This polymer was regarded as (Polymer-4).

Synthesis Example 5

Poured into a flask of 3 L were 361.2 g of 5-acetoxyacenaphthylene, 25.1 g of acenaphthylene, and 40.2 g of p-amyloxystyrene as well as 675 g of toluene as a solvent. This reaction vessel was cooled down to −70° C. in an atmosphere of nitrogen, and repetitively subjected to degasification at a reduced pressure and to a nitrogen flow, three times. After temperature elevation up to a room temperature, 34.7 g of 2,2'-azobis(2,4-dimethylvaleronitrile) (V-65 produced by Wako Pure Chemical Industries, Ltd.) as a polymerization initiator was added into the mixture; after further temperature elevation up to 55° C., reaction was conducted for 40 hours. Dropped into this reaction solution while stirring it, was a mixed solution of 970 g of methanol and 180 g of water; after 30 minutes, the lower layer (polymer layer) was vacuum concentrated; this polymer layer were again dissolved into 0.45 L of methanol and 0.54 L of tetrahydrofuran; 160 g of triethylamine and 30 g of water were added thereto; and the temperature was elevated to 60° C., to conduct a deprotection reaction for 40 hours. This deprotection reaction solution was vacuum concentrated, and 548 g of methanol and 112 g of acetone were added into the concentrated solution to thereby turn it into a solution state. Dropped into the solution while stirring it, was 990 g of hexane; after 30 minutes, 300 g of tetrahydrofuran was added into the lower layer (polymer layer); dropped into it while stirring it, was 1,030 g of hexane; and after 30 minutes, the lower layer (polymer layer) was vacuum concentrated. This polymer solution was neutralized by using 82 g of acetic acid; and the reaction solution was concentrated, then dissolved into 0.3 L of acetone, and precipitated in 10 L of water in the same manner as the above; followed by conduction of filtering and drying, to thereby obtain 240 g of copolymer of polyhydroxyacenaphthylene, acenaphthylene and amyloxystyrene.

Charged into a flask of 1 L were 50.0 g of the copolymer of polyhydroxyacenaphthylene, acenaphthylene and amyloxystyrene, and 400 g of tetrahydrofuran as a solvent. This reaction vessel was cooled down to 5° C. in a nitrogen atmosphere; 31.0 g of triethylamine was added into the mixture; and 8.2 g of the following acetalizing agent-A was thereafter droppedly poured thereinto, over a period of 1 hour; followed by temperature elevation up to a room temperature, and by reaction thereafter for 4 hours. This reaction solution was concentrated, and dissolved in 200 g of acetone; thereafter crystallized and precipitated in a solution of 7.0 L of water, for neutralization washing by acetic acid; and the obtained white solid was filtered, followed by drying at 40° C. under reduced pressure, to obtain 53.0 g of a white polymer.

The obtained polymer was subjected to $^{13}$C, $^1$H-NMR, and GPC measurements, thereby obtaining the following analysis results:

Copolymerization composition ratio:
5-hydroxyacenaphthylene:acenaphthylene:p-amyloxystyrene:5-methoxyisobutoxy-acenaphthylene=76.2:6.9:9.6:7.3
Weight-average molecular weight (Mw)=4,600
Molecular weight distribution (Mw/Mn)=1.66
This polymer was regarded as (Polymer-5).

Synthesis Example 6

The same procedure as Synthesis Example 5 was conducted for synthesis by using 25.1 g of acenaphthylene instead of 50.5 g of indene in Synthesis Example 5. The obtained polymer was subjected to $^{13}$C, $^1$H-NMR, and GPC measurements, thereby obtaining the following analysis results:

Copolymerization composition ratio:
5-hydroxyacenaphthylene:indene:p-amyloxystyrene:5-methoxyisobutoxy-acenaphthylene=76.5:6.0:9.7:7.8
Weight-average molecular weight (Mw)=4,400
Molecular weight distribution (Mw/Mn)-1.68
This polymer was regarded as (Polymer-6).

Reference Synthesis Example 7

Poured into a flask of 3 L were 361.2 g of 5-acetoxyacenaphthylene, 25.1 g of acenaphthylene, and 65.5 g of methacrylic acid ester represented by the following general formula (14), as well as 675 g of toluene as a solvent.

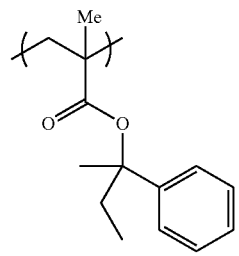

(14)

This reaction vessel was cooled down to −70° C. in an atmosphere of nitrogen, and repetitively subjected to degasification at a reduced pressure and to a nitrogen flow, three times. After temperature elevation up to a room temperature, 34.7 g of 2,2'-azobis(2,4-dimethylvaleronitrile) (V-65 produced by Wako Pure Chemical Industries, Ltd.) as a polymerization initiator was added into the mixture; after further temperature elevation up to 55° C., reaction was conducted for 40 hours. Dropped into this reaction solution while stirring it, was a mixed solution of 970 g of methanol and 180 g of water; after 30 minutes, the lower layer (polymer layer)

was vacuum concentrated; this polymer layer were again dissolved into 0.45 L of methanol and 0.54 L of tetrahydrofuran; 160 g of triethylamine and 30 g of water were added thereto; and the temperature was elevated to 60° C., to conduct a deprotection reaction for 40 hours. This deprotection reaction solution was vacuum concentrated, and 548 g of methanol and 112 g of acetone were added into the concentrated solution to thereby turn it into a solution state. Dropped into the solution while stirring it, was 990 g of hexane; after 30 minutes, 300 g of tetrahydrofuran was added into the lower layer (polymer layer); dropped into it while stirring it, was 1,030 g of hexane; and after 30 minutes, the lower layer (polymer layer) was vacuum concentrated. This polymer solution was neutralized by using 82 g of acetic acid; and the reaction solution was concentrated, then dissolved into 0.3 L of acetone, and precipitated in 10 L of water in the same manner as the above; followed by conduction of filtering and drying, to thereby obtain 242 g of copolymer of polyhydroxyacenaphthylene, acenaphthylene and methacrylic acid ester.

Charged into a flask of 1 L were 50.0 g of the copolymer of polyhydroxyacenaphthylene, acenaphthylene and methacrylic acid ester, and 400 g of tetrahydrofuran as a solvent. This reaction vessel was cooled down to 5° C. in a nitrogen atmosphere; 31.0 g of triethylamine was added into the mixture; and 8.2 g of the following acetalizing agent-A was thereafter droppedly poured thereinto, over a period of 1 hour; followed by temperature elevation up to a room temperature, and by reaction thereafter for 4 hours. This reaction solution was concentrated, and dissolved in 200 g of acetone; thereafter crystallized and precipitated in a solution of 7.0 L of water, for neutralization washing by acetic acid; and the obtained white solid was filtered, followed by drying at 40° C. under reduced pressure, to obtain 51.5 g of a white polymer.

The obtained polymer was subjected to $^{13}$C, $^1$H-NMR, and GPC measurements, thereby obtaining the following analysis results:
Copolymerization composition ratio:
5-hydroxyacenaphthylene:acenaphthylene:

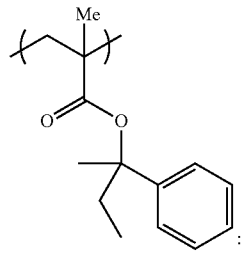

5-methoxyisobutoxy-acenaphthylene=76.4:6.8:9.7:7.1
Weight-average molecular weight (Mw)=4,400
Molecular weight distribution (Mw/Mn)=1.62
This polymer was regarded as (Reference Polymer-7).

Reference Synthesis Example 8

The same procedure as Reference Synthesis Example 7 was conducted for synthesis by using 73.4 g of methacrylic acid ester represented by the following general formula (15) instead of 65.5 g of methacrylic acid ester represented by the general formula (14) in Reference Synthesis Example 7.

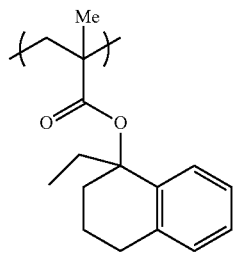

(15)

The obtained polymer was subjected to $^{13}$C, $^1$H-NMR, and GPC measurements, thereby obtaining the following analysis results:
Copolymerization composition ratio:
5-hydroxyacenaphthylene:acenaphthylene:

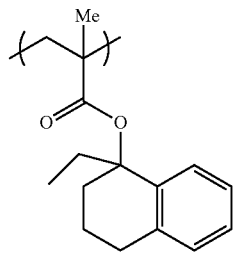

5-methoxyisobutoxy-acenaphthylene=76.4:6.8:9.7:7.1
Weight-average molecular weight (Mw)=4,500
Molecular weight distribution (Mw/Mn)=1.58
This polymer was regarded as (Reference Polymer-8).

Reference Synthesis Example 9

Poured into a flask of 3 L were 361.2 g of 5-acetoxyacenaphthylene, 42.2 g of p-amyloxystyrene, 65.5 g of methacrylic acid ester represented by the general formula (14), and 75.6 g of indene, as well as 675 g of toluene as a solvent. This reaction vessel was cooled down to –70° C. in an atmosphere of nitrogen, and repetitively subjected to degasification at a reduced pressure and to a nitrogen flow, three times. After temperature elevation up to a room temperature, 34.7 g of 2,2'-azobis(2,4-dimethylvaleronitrile) (V-65 produced by Wako Pure Chemical Industries, Ltd.) as a polymerization initiator was added into the mixture; after further temperature elevation up to 55° C., reaction was conducted for 40 hours. Dropped into this reaction solution while stirring it, was a mixed solution of 970 g of methanol and 180 g of water; after 30 minutes, the lower layer (polymer layer) was vacuum concentrated; this polymer layer were again dissolved into 0.45 L of methanol and 0.54 L of tetrahydrofuran; 160 g of triethylamine and 30 g of water were added thereto; and the temperature was elevated to 60° C., to conduct a deprotection reaction for 40 hours. This deprotection reaction solution was vacuum concentrated, and 548 g of methanol and 112 g of acetone were added into the concentrated solution to thereby turn it into a solution state. Dropped into the solution while stirring it, was 990 g of hexane; after 30 minutes, 300 g of tetrahydrofuran was added into the lower layer (polymer layer); dropped into it while stirring it, was 1,030 g of hexane; and after 30 minutes, the lower layer (polymer layer) was vacuum concentrated. This polymer solution was neutralized by using 82 g of acetic acid; and the reaction solution was concentrated, then dissolved into 0.3 L of acetone, and precipitated in 10 L of water in the same manner as the above; followed by conduction of filtering and drying, to thereby obtain 243 g of copolymer of polyhydroxyacenaphthylene, amyloxystyrene, methacrylic acid ester, and indene.

Charged into a flask of 1 L were 50.0 g of the copolymer of polyhydroxyacenaphthylene, amyloxystyrene, methacrylic acid ester, and indene, and 400 g of tetrahydrofuran as a solvent. This reaction vessel was cooled down to 5° C. in a nitrogen atmosphere; 31.0 g of triethylamine was added into the mixture; and 8.2 g of the following acetalizing agent-A was thereafter droppedly poured thereinto, over a period of 1 hour; followed by temperature elevation up to a room temperature, and by reaction thereafter for 4 hours. This reaction solution was concentrated, and dissolved in 200 g of acetone; thereafter crystallized and precipitated in a solution of 7.0 L of water, for neutralization washing by acetic acid; and the obtained white solid was filtered, followed by drying at 40° C. under reduced pressure, to obtain 54.1 g of a white polymer.

The obtained polymer was subjected to $^{13}C$, $^{1}H$-NMR, and GPC measurements, thereby obtaining the following analysis results:

Copolymerization composition ratio:
5-hydroxyacenaphthylene: 5-methoxyisobutoxy-acenaphthylene: p-amyloxystyrene:

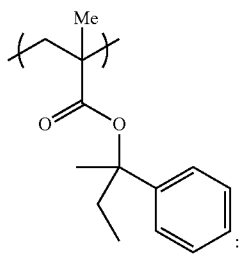

indene=62.9:7.1:12.8:10.8:6.4
Weight-average molecular weight (Mw)=4,700
Molecular weight distribution (Mw/Mn)=1.65
This polymer was regarded as (Reference Polymer-9).

Comparative Synthesis Example 1

Poured into a flask of 3 L were 279.0 g of 4-acetoxystyrene and 37.7 g of acenaphthylene, as well as 675 g of toluene as a solvent. This reaction vessel was cooled down to –70° C. in an atmosphere of nitrogen, and repetitively subjected to degasification at a reduced pressure and to a nitrogen flow, three times. After temperature elevation up to a room temperature, 34.7 g of 2,2'-azobis(2,4-dimethylvaleronitrile) (V-65 produced by Wako Pure Chemical Industries, Ltd.) as a polymerization initiator was added into the mixture; after further temperature elevation up to 55° C., reaction was conducted for 40 hours. Dropped into this reaction solution while stirring it, was a mixed solution of 970 g of methanol and 180 g of water; after 30 minutes, the lower layer (polymer layer) was vacuum concentrated; this polymer were again dissolved into 0.45 L of methanol and 0.54 L of tetrahydrofuran layer; 160 g of triethylamine and 30 g of water were added thereto; and the temperature was elevated to 60° C., to conduct a deprotection reaction for 40 hours. This deprotection reaction solution was vacuum concentrated, and 548 g of methanol and 112 g of acetone were added into the concentrated solution to thereby turn it into a solution state. Dropped into the solution while stirring it, was 990 g of hexane; after 30 minutes, 300 g of tetrahydrofuran was added into the lower layer (polymer layer); dropped into it while stirring it, was 1,030 g of hexane; and after 30 minutes, the lower layer (polymer layer) was vacuum concentrated. This polymer solution was neutralized by using 82 g of acetic acid; and the reaction solution was concentrated, then dissolved into 0.3 L of acetone, and precipitated in 10 L of water in the same manner as the above; followed by conduction of filtering and drying, to thereby obtain 243.5 g of copolymer of polyhydroxystyrene and acenaphthylene.

Charged into a flask of 1 L were 50.0 g of the copolymer of polyhydroxystyrene and acenaphthylene, and 400 g of tetrahydrofuran as a solvent. This reaction vessel was cooled down to 5° C. in a nitrogen atmosphere; 31.0 g of triethylamine was added into the mixture; and 14.9 g of the following acetalizing agent-A was thereafter droppedly poured thereinto, over a period of 1 hour; followed by temperature elevation up to a room temperature, and by reaction thereafter for 4 hours. This reaction solution was concentrated, and dissolved in 200 g of acetone; thereafter crystallized and precipitated in a solution of 7.0 L of water, for neutralization washing by acetic acid; and the obtained white solid was filtered, followed by drying at 40° C. under reduced pressure, to obtain 52.0 g of a white polymer.

The obtained polymer was subjected to $^{13}C$, $^{1}H$-NMR, and GPC measurements, thereby obtaining the following analysis results:

Copolymerization composition ratio:
4-hydroxystyrene:acenaphthylene:4-methoxyisobutoxystyrene=74.9:10.2:14.9
Weight-average molecular weight (Mw)=4,200
Molecular weight distribution (Mw/Mn)=1.78
This polymer was regarded as (Comparative Polymer-1).

Comparative Synthesis Example 2

Poured into a flask of 3 L were 140.0 g of 4-acetoxystyrene, 220.8 g of 5-acetoxyacenaphthylene and 37.7 g of acenaphthylene as well as 675 g of toluene as a solvent. The same synthesis procedure as Comparative Synthesis Example 1 was conducted to obtain an acetalized copolymer.

The obtained polymer was subjected to $^{13}C$, $^{1}H$-NMR, and GPC measurements, thereby obtaining the following analysis results:

Copolymerization composition ratio:
4-hydroxystyrene:5-hydroxyacenaphthylene:acenaphthylene:4-methoxyisobutoxystyrene:5-methoxyisobutoxy-acenaphthylene:=34.9:39.5:10.1:9.9:5.6
Weight-average molecular weight (Mw)=4,300
Molecular weight distribution (Mw/Mn)=1.62
This polymer was regarded as (Comparative Polymer-2).

Comparative Synthesis Example 3

Poured into a flask of 3 L were 350 g of 6-acetoxyindene, 36.0 g of indene, as well as 675 g of toluene as a solvent. This reaction vessel was cooled down to –70° C. in an atmosphere of nitrogen, and repetitively subjected to degasification at a reduced pressure and to a nitrogen flow, three times. After temperature elevation up to a room temperature, 40.5 g of 2,2'-azobis(2,4-dimethylvaleronitrile): (V-65 produced by Wako Pure Chemical Industries, Ltd.) as a polymerization initiator was added into the mixture; after further temperature elevation up to 45° C., reaction was conducted for 20 hours; and after temperature elevation thereafter up to 55° C., reaction was further conducted for 20 hours. This reaction solution was then concentrated to ½, and precipitated in 15.0 L of a methanol solution; and the obtained white solid was filtered, followed by drying at 40° C. under reduced pressure, to obtain 154 g of a copolymer of polyhydroxyindene and indene. The yield (40%) was inferior as compared to the yield of 62% of polymerization based on acenaphthylene units.

Charged into a flask of 1 L were 50.0 g of the copolymer of polyhydroxyindene and indene, and 400 g of tetrahydrofuran as a solvent. This reaction vessel was cooled down to 5° C. in a nitrogen atmosphere; 31.0 g of triethylamine was added into the mixture; and 14.9 g of the following acetalizing agent-A was thereafter droppedly poured thereinto, over a period of 1 hour; followed by temperature elevation up to a room temperature, and by reaction thereafter for 4 hours. This reaction solution was concentrated, and dissolved in 200 g of acetone; thereafter crystallized and precipitated in a solution of 7.0 L of water, for neutralization washing by acetic acid; and the obtained white solid was filtered, followed by drying at 40° C. under reduced pressure, to obtain 50.2 g of a white polymer.

The obtained polymer was subjected to $^{13}C$, $^{1}H$-NMR, and GPC measurements, thereby obtaining the following analysis results:

Copolymerization composition ratio (molar ratio):
6-hydroxyindene:indene:6-methoxyisobutoxy-indene=71.9:14.2:13.9

Weight-average molecular weight (Mw)=4,300
Molecular weight distribution (Mw/Mn)=1.78
This polymer was regarded as (Comparative Polymer-3).

From the Comparative Synthesis Example 3, it is understood that the synthesis of the polymer based on the indene unit is insufficient in yield, and exhibits a considerable discrepancy between the usage amount ratio of the monomers and the copolymerization composition ratio. Contrary, it is understood that the polymer such as in Synthesis Example 1 based on acenaphthylene exhibits substantially the same copolymerization composition ratio as the usage amount ratio, thereby facilitating the control of polymerization.

Further, as seen in Synthesis Example 2, for example, since indene is insufficient in copolymerization reactivity, it was required to use indene in a charging amount about three times that of acenaphthylene, in terms of number of moles.

The acetalizing agent-A and the acetalizing agent-B used in Synthesis Examples and Comparative Synthesis Examples are shown below.

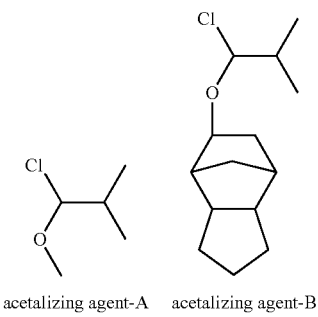

acetalizing agent-A    acetalizing agent-B

Examples 1 to 6, Comparative Examples 1 to 3 and Reference Examples 7 to 9

The materials constituting the resist composition, solvents, and the like used in Examples, Comparative Examples and Reference Examples are shown below.

The base resins used in Examples are Polymer-1 to Polymer-6 each obtained in the Synthesis Examples 1 to 6. The base resins used in Comparative Examples are Comparative Polymer-1 to Comparative Polymer-3, and used in Reference Examples 7-9 are Reference Polymer-7 to Reference Polymer-9 each obtained in the Comparative Synthesis Examples 1 to 3 and Reference Synthesis Examples 7-9, respectively.

The acid generator used in Examples and Comparative Examples are shown below.

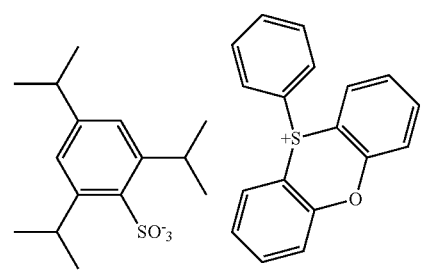

PAG-1

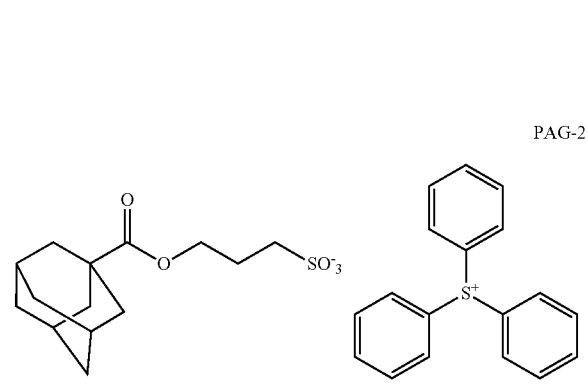

PAG-2

The organic solvents used in Examples and Comparative Examples are shown below.

Solvent A: propyleneglycol methyl ether (PGME)

Solvent B: ethyl lactate (EL)

Solvent C: propyleneglycol monomethyl ether acetate (PGMEA)

The amine compounds and the amine oxide compounds each having a carboxyl group but not having active hydrogen atoms, and the basic component not containing a carboxyl group (Quencher), used in Examples and Comparative Examples are following compounds.

Quencher-1: p-diethylaminobenzoic acid

Quencher-2: p-dibutylaminobenzoic acid

Quencher-3: oxide of p-dibutylaminobenzoic acid

Quencher-4: 1-piperidine propionic acid

Quencher-5: tris(2-(methoxymethoxy)ethyl)amine

Quencher-6: oxide of tris(2-(methoxymethoxy)ethyl)amine

Quencher-7: N-2-(acetoxy)ethyl imidazole

The surfactant A used in Examples and Comparative Examples is PF-636 (produced by Omnova Solutions Inc.)

The base resin, the acid generator, the basic component, the organic solvent, and the surfactant were prepared in the ratio shown in following Table 1, to obtain positive resist compositions of Examples 1-6, Comparative Examples 1 to 3 and Reference Examples 7-9.

TABLE 1

| Composition (parts by mass) | Ex. 1 | Ex. 2 | Ex. 3 | Ex. 4 | Ex. 5 | Ex. 6 | Ex. 7 |
|---|---|---|---|---|---|---|---|
| polymer-1 | 80 | | | | | | |
| polymer-2 | | 80 | | | | | |
| polymer-3 | | | 80 | | | | |
| polymer-4 | | | | 80 | | | |
| polymer-5 | | | | | 80 | | |
| polymer-6 | | | | | | 80 | |
| Reference polymer-7 | | | | | | | 80 |
| Reference polymer-8 | | | | | | | |
| Reference polymer-9 | | | | | | | |
| Comparative polymer-1 | | | | | | | |
| Comparative polymer-2 | | | | | | | |
| Comparative polymer-3 | | | | | | | |
| PAG-2 | 8 | 8 | 8 | 8 | 8 | 8 | 8 |
| Quencher-1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 |
| Solvent A | 800 | 800 | 800 | 800 | 800 | 800 | 800 |
| Solvent B | 800 | 800 | 800 | 800 | 800 | 800 | 800 |
| Solvent C | 1,000 | 1,000 | 1,000 | 1,000 | 1,000 | 1,000 | 1,000 |

| Composition (parts by mass) | Ex. 8 | Ex. 9 | Com. Ex. 1 | Com. Ex. 2 | Com. Ex. 3 |
|---|---|---|---|---|---|
| polymer-1 | | | | | |
| polymer-2 | | | | | |
| polymer-3 | | | | | |
| polymer-4 | | | | | |
| polymer-5 | | | | | |
| polymer-6 | | | | | |
| Reference polymer-7 | | | | | |
| Reference polymer-8 | 80 | | | | |
| Reference polymer-9 | | 80 | | | |
| Comparative polymer-1 | | | 80 | | |
| Comparative polymer-2 | | | | 80 | |
| Comparative polymer-3 | | | | | 80 |
| PAG-2 | 8 | 8 | 8 | 8 | 8 |
| Quencher-1 | 0.1 | 0.1 | 0.1 | 0.1 | 0.1 |
| Quencher-4 | 0.1 | 0.1 | 0.1 | 0.1 | 0.1 |
| Surfactant A | 0.07 | 0.07 | 0.07 | 0.07 | 0.07 |
| Solvent A | 800 | 800 | 800 | 800 | 800 |
| Solvent B | 800 | 800 | 800 | 800 | 800 |
| Solvent C | 1,000 | 1,000 | 1,000 | 1,000 | 1,000 |

The obtained positive resist compositions were filtered through a 0.04-μm filter made of a nylon resin, and then applied on a square mask blank with 152 mm on a side whose outermost surface is formed of a chromium oxide nitride film at the rotation speed of 1,700 rpm by a spin coating method to obtain the thickness of 90 nm.

Then, this mask blank was baked on a hot plate at 90° C. for 10 minutes.

The film thickness was measures with an optical measurement instrument NanoSpec (manufactured by Nanometrics Inc.). The measurements were made on 81 spots in the plane of the blank substrate except for a peripheral area within 10 mm from the blank periphery to obtain the average film thickness and the film thickness range.

Then, the exposure was made with an electron beam exposure instrument EBM 5000 (manufactured by NuFlare Technology, Inc., acceleration voltage of 50 keV), which was followed by the post-exposure bake (PEB) at 90° C. for 10 minutes and then spray development in a 2.38% aqueous tetramethyl ammonium hydroxide solution to obtain a positive pattern (Examples 1 to 6, Comparative Examples 1 to 3 and Reference Examples 7 to 9).

The resist patterns thus obtained were evaluated as follows.

The exposure amount at which a top and a bottom of the 200-nm line-and-space was resolved with 1:1 was taken as the optimum exposure amount (sensitivity: Eop), and the minimum line width of a separated line-and-space at this exposure amount was taken as the resolution of the resist to be evaluated. A resist cross section of the resolved resist pattern profile was observed with regard to especially whether or not a footing occurred at the substrate surface by using a scanning electron microscope.

For line edge roughness (LER), 3σ was calculated by measuring 50 points over 5 μm in a longitudinal direction of a 100 nm line pattern (S-8840 manufactured by Hitachi, Ltd.). Smaller values represent better performances.

Moreover, the dry etching resistance of each resist material was indicated as a ratio of its decreased resist amount when the decreased amount of film thickness of the resist of Comparative Example 1 after etching was evaluated as 1.0, in a manner to actually conduct etching of each resist by an apparatus TE-8500S manufactured by Tokyo Electron Limited and to observe a pattern profile thereafter in a cross-section of the resist by a scanning electron microscope. Namely, smaller values imply resists which are more enhanced in etching resistance. Further, etching was conducted under the condition shown hereinafter:
Prees: 250 mJ,
RF power: 800 W,
Gas: 1) $CHF_3$ 20 sccm,
2) $CF_4$ 20 sccm,
3) Ar 400 sccm,
etching time: 2 minutes and 30 seconds.

The results of the evaluation of the resolutions and Pattern's cross section profile, and the etching resistance are shown in Table 2.

TABLE 2

| | Resolution (nm) | Pattern's cross section profile | LER (nm) | Relative etching resistance (Relative decreased amount of film thickness) |
|---|---|---|---|---|
| Example 1 | 50 | Good | 4 | 0.7 |
| Example 2 | 50 | Good | 4 | 0.75 |
| Example 3 | 50 | Good | 4 | 0.7 |
| Example 4 | 50 | Good | 4 | 0.75 |
| Example 5 | 50 | Good | 3.5 | 0.75 |
| Example 6 | 50 | Good | 3.5 | 0.75 |
| Reference Example 7 | 50 | Good | 3.5 | 0.8 |
| Reference Example 8 | 50 | Good | 3.5 | 0.8 |
| Reference Example 9 | 50 | Good | 3.5 | 0.8 |
| Comparative Example 1 | 60 | Good | 4 | 1 |
| Comparative Example 2 | 55 | Good | 4 | 0.9 |
| Comparative Example 3 | 50 | Good | 4.5 | 0.8 |

From Table 2, it was firstly understood that Example 1, adopting acenaphthylene units instead of styrene units of Comparative Example 1, exhibited a smaller value of 0.7-fold for an etching resistance indicated as a decreased amount of film thickness after etching. Similarly, Comparative Example 2 adopting acenaphthylene instead of part of styrene units of Comparative Example 1 exhibited a smaller value for a decreased amount of film thickness after etching, than that of Comparative Example 1, thereby revealing that acenaphthylene is useful for an enhanced etching resistance.

Further, since Examples 1 to 6 each included acenaphthylene derivatives at a ratio of 70 mole % or more relative to the whole, they each exhibited a value smaller than 0.8-fold of the etched amount of Comparative Example 1.

From this result, it was understood that an etching resistance could be enhanced by changing styrene units to acenaphthylene units, and that the etching resistance could be further enhanced by containing acenaphthylene units at a ratio of 70 mole % or more relative to the whole.

Polymer-1 to Polymer-6 (Examples 1 to 6) each configured to possess a function of solubility in alkali by means of 5-hydroxy-acenaphthylene unit, were each capable of resolving a pattern of 50 nm without any footing profile and bridges in profile. Contrary, in the case of the resist (Comparative Example 1) configured to possess a function of solubility in alkali by means of 4-hydroxy-acenaphthylene unit, and in the case of the resist (Comparative Example 2) configured to contain acenaphthylene derivatives at a ratio less than 70 mole %, although footing profile was avoided by virtue of effects of the amines (Quencher-1 and Quencher-4) each having a carboxyl group, bridges were caused between pattern lines to thereby fail to resolve a pattern of 50 nm. In Examples 1 to 6, it was considered that the base resins were made rigid by adopting the repeating units having acenaphthylene units as main constituent components and the ratios thereof were 70 mole % or more relative to total amounts of all repeating units, respectively, so that swelling of pattern upon alkaline development was restricted.

Although Comparative Example 3 was capable of resolving a pattern of 50 nm and exhibited an etching resistance restricted to 0.8-fold of the etched amount of Comparative Example 1 because the resist of Comparative Example 3 was based on indenes exhibiting enhanced etching resistances, the etching resistance of Comparative Example 3 was inferior to that of Example 1 based on acenaphthylene.

Further, as described in the paragraph [0113] of this specification, in case that the indene units were based, since monomers of indene are not excellent in polymerizing ability, main adoption of indene units led to a slightly increased degree of molecular weight dispersity, and to a tendency of deteriorated LER. Such adoption also left a problem of failure of polymer synthesis in a stable manner.

Examples 10 to 15

As positive resist compositions of the present invention, the following resist material were each prepared by blending an amine compound having a carboxyl group and having no hydrogen atoms covalently bonded to a nitrogen atom as a basicity center, with an amine compound containing no carboxyl groups as listed in the following Table 3, and positive patterns were formed in the same manner as Examples 1 to 6. The resolutions and pattern profiles thereof were evaluated. The results thereof are listed in Table 4.

TABLE 3

| Composition (parts by mass) | Ex. 10 | Ex. 11 | Ex. 12 | Ex. 13 | Ex. 14 | Ex. 15 |
|---|---|---|---|---|---|---|
| polymer-3 | 80 | 80 | 80 | 80 | 80 | 80 |
| PAG-2 | 8 | 8 | 8 | 8 | 8 | 8 |
| Quencher-1 | | | | 0.1 | | |
| Quencher-2 | | | | | 0.1 | |
| Quencher-3 | | | | | | 0.1 |
| Quencher-4 | 0.1 | 0.1 | 0.1 | | | |

TABLE 3-continued

| Composition (parts by mass) | Ex. 10 | Ex. 11 | Ex. 12 | Ex. 13 | Ex. 14 | Ex. 15 |
|---|---|---|---|---|---|---|
| Quencher-5 | 0.1 | | | 0.1 | 0.1 | 0.1 |
| Quencher-6 | | 0.1 | | | | |
| Quencher-7 | | | 0.1 | | | |
| Surfactant A | 0.07 | 0.07 | 0.07 | 0.07 | 0.07 | 0.07 |
| Solvent A | 800 | 800 | 800 | 800 | 800 | 800 |
| Solvent B | 800 | 800 | 800 | 800 | 800 | 800 |
| Solvent C | 1,000 | 1,000 | 1,000 | 1,000 | 1,000 | 1,000 |

TABLE 4

| Composition (parts by mass) | resolution (nm) | LER (nm) | Pattern's cross section profile |
|---|---|---|---|
| Example 10 | 50 | 4 | Good |
| Example 11 | 50 | 4 | Good |
| Example 12 | 50 | 4 | Good |
| Example 13 | 50 | 4 | Good |
| Example 14 | 50 | 4 | Good |
| Example 15 | 50 | 4 | Good |

As listed in Table 4, it was possible to form pattern lines of 50 nm without any footing profile, in all Examples each having an appropriate combination of one of Quencher-1 to Quencher-4 as an amine compound or amine oxide compound having a carboxyl group and having no active hydrogen atoms, with one of Quencher-5 to Quencher-7 as an amine compound containing no carboxyl groups.

Examples 16 to 21

As positive resist compositions of the present invention, the following ones were each prepared by blending an amine compound having a carboxyl group and having no hydrogen atoms covalently bonded to a nitrogen atom as a basicity center, with an amine compound containing no carboxyl groups as listed in following Table 5, and positive patterns were formed in the same manner as Examples 1 to 6. The resolutions and pattern profiles thereof were evaluated. The results thereof are listed in following Table 6. Electron beam sensitivity is listed at the lowermost row of Table 5.

TABLE 5

| Composition (parts by mass) | Ex. 16 | Ex. 17 | Ex. 18 | Ex. 19 | Ex. 20 | Ex. 21 |
|---|---|---|---|---|---|---|
| polymer-3 | 80 | 80 | 80 | 80 | 80 | 80 |
| PAG-2 | 8 | 8 | 8 | 8 | 8 | 8 |
| Quencher-1 | 0.1 | 0.1 | 0.1 | | | |
| Quencher-4 | | | | 0.1 | 0.2 | 0.3 |
| Quencher-5 | 0.2 | | | | | |
| Quencher-6 | | 0.2 | | | | |
| Quencher-7 | | | 0.2 | | | |
| Surfactant A | 0.07 | 0.07 | 0.07 | 0.07 | 0.07 | 0.07 |
| Solvent A | 800 | 800 | 800 | 800 | 800 | 800 |
| Solvent B | 800 | 800 | 800 | 800 | 800 | 800 |
| Solvent C | 1,000 | 1,000 | 1,000 | 1,000 | 1,000 | 1,000 |
| Electron beam sensitivity ($\mu C/cm^2$) | 13 | 13 | 13 | 8 | 14 | 20 |

TABLE 6

| Composition (parts by mass) | resolution (nm) | LER (nm) | Pattern's cross section profile |
|---|---|---|---|
| Example 16 | 50 | 4 | Good |
| Example 17 | 50 | 4 | Good |
| Example 18 | 50 | 4 | Good |
| Example 19 | 50 | 4 | Good |
| Example 20 | 50 | 4 | Good |
| Example 21 | 50 | 4 | Good |

As listed in Table 5 and Table 6, although increased amounts of amine compounds (Quencher) resulted in deteriorated sensitivities, resolutions were never deteriorated. In all Examples, patterns of 50 nm were allowed to be formed without footing profile. It was thus confirmed that a sensitivity required in a process could be adjusted by an amount of an amine compound in the above manner.

Examples 22 to 27 and Reference Examples 28 to 30

As positive resist compositions of the present invention, the following ones were each prepared by using PAG-1 instead of PAG-2 as a acid generator as listed in the following Table 7, and positive patterns were formed in the same manner as Examples 1 to 6. The results of evaluation of resolutions and pattern profiles are listed in the following Table 8.

TABLE 7

| Composition (parts by mass) | Ex. 22 | Ex. 23 | Ex. 24 | Ex. 25 | Ex. 26 | Ex. 27 | Ex. 28 | Ex. 29 | Ex. 30 |
|---|---|---|---|---|---|---|---|---|---|
| polymer-1 | 80 | | | | | | | | |
| polymer-2 | | 80 | | | | | | | |
| polymer-3 | | | 80 | | | | | | |
| polymer-4 | | | | 80 | | | | | |
| polymer-5 | | | | | 80 | | | | |
| polymer-6 | | | | | | 80 | | | |
| Reference polymer-7 | | | | | | | 80 | | |
| Reference polymer-8 | | | | | | | | 80 | |
| Reference polymer-9 | | | | | | | | | 80 |
| PAG-1 | 8 | 8 | 8 | 8 | 8 | 8 | 8 | 8 | 8 |
| Quencher-1 | 0.1 | 0.1 | 0.1 | 0.1 | 0.1 | 0.1 | 0.1 | 0.1 | 0.1 |
| Quencher-4 | 0.1 | 0.1 | 0.1 | 0.1 | 0.1 | 0.1 | 0.1 | 0.1 | 0.1 |
| Surfactant A | 0.07 | 0.07 | 0.07 | 0.07 | 0.07 | 0.07 | 0.07 | 0.07 | 0.07 |
| Solvent A | 800 | 800 | 800 | 800 | 800 | 800 | 800 | 800 | 800 |
| Solvent B | 800 | 800 | 800 | 800 | 800 | 800 | 800 | 800 | 800 |
| Solvent C | 1,000 | 1,000 | 1,000 | 1,000 | 1,000 | 1,000 | 1,000 | 1,000 | 1,000 |

TABLE 8

| Composition (parts by mass) | resolution (nm) | LER (nm) | Pattern's cross section profile |
|---|---|---|---|
| Example 22 | 50 | 4 | Good |
| Example 23 | 50 | 4 | Good |
| Example 24 | 50 | 4 | Good |
| Example 25 | 50 | 4 | Good |
| Example 26 | 50 | 3.5 | Good |
| Example 27 | 50 | 3.5 | Good |
| Reference Example 28 | 50 | 3.5 | Good |
| Reference Example 29 | 50 | 3.5 | Good |
| Reference Example 30 | 50 | 3.5 | Good |

As listed in Table 8, it was possible in each Example to form a pattern of 50 nm without footing profile and bridges in profile, though line heads were slightly rounded as compared to the results of Examples 1 to 6 each adopting PAG-2.

As described above, it was recognized to be possible to form an excellent pattern profile even at a substrate-side boundary face of a resist while satisfying performances demanded for etching resistance, resolution, and the like of a positive resist, by adopting, as a base resin of a positive resist composition: a polymer containing repeating units each represented by the above general formula (1); or a polymer containing repeating units each represented by the general formula (1), and containing at least one or more kinds of repeating units each represented by the above general formula (2) and repeating units each represented by the above general formula (3); wherein the base resin contains the repeating units represented by the general formulae (1), (2), and (3), respectively, at a sum ratio of 70 mole % or more relative to a total amount of all repeating units constituting the base resin.

Particularly, since it was proven that an excellent pattern profile was allowed to be formed even at a substrate-side boundary face of a resist while satisfying performances demanded for etching resistance, resolution, and the like even in Examples (Reference Examples 9 and 30) adopting Reference Polymer-9 where the repeating units having acenaphthylene derivatives were included in an amount of 70.0 mole %, it was proven that a great significance resides in the present invention configured to adopt, as the base resin: a polymer containing repeating units each represented by the above general formula (1); or a polymer containing repeating units each represented by the general formula (1), and containing at least one or more kinds of repeating units each represented by the above general formula (2) and repeating units each represented by the above general formula (3); wherein the base resin contains the repeating units represented by the general formulae (1), (2), and (3), respectively, at a sum ratio of 70 mole % or more relative to a total amount of all repeating units constituting the base resin.

Namely, it was confirmed that it was enabled to form a positive resist having an enhanced etching resistance and an excellent resolution by adopting the positive resist composition of the present invention, and it was enabled to form a pattern with higher precision on a substrate, and particularly to form an excellent pattern profile even at a substrate-side boundary face of a resist, by adopting the positive resist composition of the present invention.

The present invention is not restricted to the foregoing embodiments. The foregoing embodiments are merely examples so that any embodiment composed of substantially the same technical concept as disclosed in the claims of the present invention and expressing similar functions and effects are included in the technical scope of the present invention.

What is claimed is:

1. A positive resist composition comprising at least:
(A) a base resin, which has acidic functional groups protected by acid labile groups, respectively, and is insoluble or hardly soluble in alkali, and which is turned to be soluble in alkali upon elimination of the acid labile groups;
(B) an acid generator; and
(C) a nitrogen-containing compound as a basic component;
wherein the base resin is a polymer consisting of repeating units selected from repeating units represented by the following general formulae (1), (2), (3), (4), (6), (6)', and (9); further wherein the polymer contains repeating units each represented by the general formula (1) and, as the repeating units having the acidic functional groups protected by the acid labile groups, respectively, at least one or more repeating units each represented by the general formulae (2), (4), and (6), and when the polymer does not contain the repeating unit represented by the general formula (2), the polymer contains at least the repeating unit represented by the general formula (3); and wherein the base resin contains the repeating units represented by the general formulae (1), (2), and (3), respectively, at a sum ratio of 70 mole % or more relative to a total amount of all repeating units constituting the base resin:

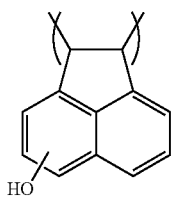
(1)

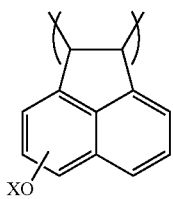
(2)

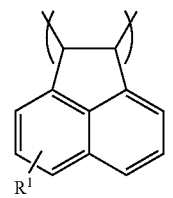
(3)

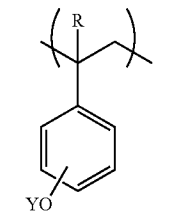
(4)

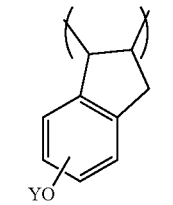
(6)

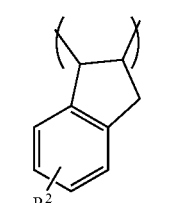
(6')

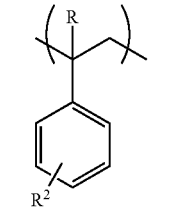
(9)

wherein,

X represents an acid labile group; and $R^1$ represents a hydrogen atom, a halogen atom, a linear, branched, or cyclic alkyl group having 1 to 10 carbon atoms, a linear, branched, or cyclic alkoxy group having 1 to 10 carbon atoms and being uneliminatable by an acid, or a linear, branched, or cyclic acyl group having 1 to 10 carbon atoms and being uneliminatable by an acid;

wherein X and $R^1$ may be selected in multiple kinds, respectively;

Y represents an acid labile group; and

R represents a hydrogen atom or a methyl group;

wherein Y and R may be selected in multiple kinds, respectively;

$R^2$ represents a hydrogen atom, a hydroxyl group, a linear, branched, or cyclic alkyl group having 1 to 10 carbon atoms, a linear, branched, or cyclic alkoxy group having 1 to 10 carbon atoms and being uneliminatable by an acid, or a linear, branched, or cyclic acyl group having 1 to 10 carbon atoms and being uneliminatable by an acid; and wherein $R^2$ may be selected in multiple kinds.

2. The positive resist composition according to claim 1, wherein the base resin contains, as the repeating units having the acidic functional groups protected by the acid labile groups, respectively, the repeating units each represented by the general formulae (2) and (4); and the acid labile group X is an acetal group, and acid labile group Y is a tertiary alkyl group having 4 to 15 carbon atoms.

3. The positive resist composition according to claim 2, wherein the base resin contains at least one or more kinds of repeating units each represented by the general formulae (9) and (6').

4. The positive resist composition according to claim 1, wherein the base resin contains at least one or more kinds of repeating units each represented by the general formulae (9) and (6').

5. The positive resist composition according to claim 1, wherein the composition includes, as the acid generator as the component (B), an acid generator represented by the following general formula (10):

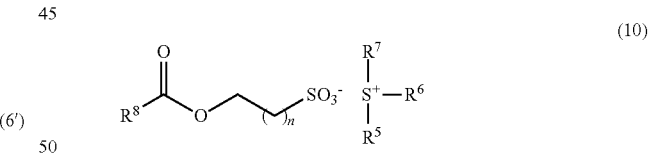
(10)

wherein, $R^5$, $R^6$, and $R^7$ each independently represent a substituted or unsubstituted linear or branched alkyl group, alkenyl group, or oxoalkyl group having 1 to 10 carbon atoms, or a substituted or unsubstituted aryl group, aralkyl group, or aryloxoalkyl group having 6 to 18 carbon atoms, or any two or more of $R^5$, $R^6$, and $R^7$ may be bonded to each other through a single bond or through an ether bond via oxygen atom, to form a ring together with the sulfur atom in the formula;

$R^8$ represents an aromatic ring, or a monovalent hydrocarbon group having an alicyclic hydrocarbon structure having 5 or more carbon atoms; and "n" represents an integer of 1 to 3.

6. The positive resist composition according to claim 1, wherein the composition includes, as the basic component as the component (C), at least one or more kinds of amine compounds and amine oxide compounds, each having at least a carboxyl group and each having no hydrogen atoms covalently bonded to a nitrogen atom as a basicity center.

7. The positive resist composition according to claim 6, wherein the composition includes, as the amine compounds and amine oxide compounds, each having a carboxyl group and each having no hydrogen atoms covalently bonded to a nitrogen atom as a basicity center, at least one or more kinds of compounds represented by the following general formulae (11) to (13), respectively:

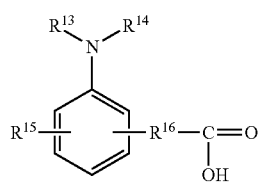

(11)

wherein,
$R^{13}$ and $R^{14}$ represent each a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, or an alkylthio-alkyl group having 1 to 10 carbon atoms;

$R^{13}$ and $R^{14}$ may be bonded to each other to form a ring structure;

$R^{15}$ represents a hydrogen atom, a linear, branched, or cyclic alkyl group having 1 to 20 carbon atoms, an aryl group having 6 to 20 carbon atoms, an aralkyl group having 7 to 20 carbon atoms, a hydroxyalkyl group having 2 to 10 carbon atoms, an alkoxyalkyl group having 2 to 10 carbon atoms, an acyloxyalkyl group having 3 to 10 carbon atoms, an alkylthio-alkyl group having 1 to 10 carbon atoms, a halogen atom, or a hydroxyl group; and may form a ring together with a carbon to which $R^{15}$ is bonded and together with another carbon adjacent to the carbon; and $R^{16}$ represents a single bond, or a linear, branched, or cyclic alkylene group having 1 to 20 carbon atoms, or an arylene group having 6 to 20 carbon atoms, which group may include one or several hydroxyl groups, carboxyl groups, carbonyl groups, and the like;

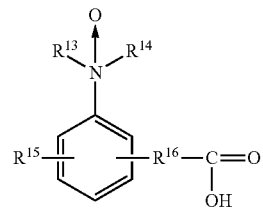

(12)

wherein, $R^{13}$, $R^{14}$, $R^{15}$, and $R^{16}$ represent the same as the above; and

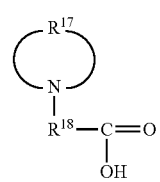

(13)

wherein,
$R^{17}$ represents a linear or branched substitutable alkylene group having 2 to 20 carbon atoms, wherein the alkylene group may include, between its carbon atoms, one or several carbonyl groups, ether groups, ester groups, or sulfides; and $R^{18}$ represents a linear, branched, or cyclic alkylene group having 1 to 20 carbon atoms, or an arylene group having 6 to 20 carbon atoms.

8. A resist pattern forming process for forming a resist pattern by lithography, comprising at least the steps of:
forming a resist film on a targeted substrate, by using the positive resist composition according to claim 1;
exposing the resist film to a high energy beam; and
developing the resist film by an alkaline developer, to obtain a resist pattern.

9. The resist pattern forming process according to claim 8, wherein a photomask blank is used as the targeted substrate.

10. The resist pattern forming process according to claim 9, wherein the photomask blank has an outermost obverse layer having a chromium compound film deposited thereon.

* * * * *